United States Patent
Naganuma et al.

(10) Patent No.: US 8,569,630 B2
(45) Date of Patent: Oct. 29, 2013

(54) FLEX-RIGID WIRING BOARD AND METHOD FOR MANUFACTURING THE SAME

(75) Inventors: Nobuyuki Naganuma, Ogaki (JP); Michimasa Takahashi, Ogaki (JP); Masakazu Aoyama, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 319 days.

(21) Appl. No.: 12/914,378

(22) Filed: Oct. 28, 2010

(65) Prior Publication Data

US 2011/0180307 A1    Jul. 28, 2011

Related U.S. Application Data

(60) Provisional application No. 61/297,412, filed on Jan. 22, 2010.

(51) Int. Cl.
*H05K 1/00* (2006.01)
*H05K 3/36* (2006.01)

(52) U.S. Cl.
USPC ............................................. 174/254; 29/830

(58) Field of Classification Search
USPC ................... 174/254, 255, 261; 361/749–751; 29/830
See application file for complete search history.

(56) References Cited

U.S. PATENT DOCUMENTS

2007/0012475 A1* 1/2007 Kawaguchi et al. .......... 174/255
2008/0099230 A1 5/2008 Takahashi et al.

FOREIGN PATENT DOCUMENTS

| CN | 1507312 A | 6/2004 |
|---|---|---|
| CN | 1806474 A | 7/2006 |
| CN | 101631424 A | 1/2010 |
| JP | 10-200258 | 7/1998 |
| JP | 2004-186235 | 7/2004 |
| JP | 2005-322871 | 11/2005 |
| JP | 2005-353861 | 12/2005 |
| JP | 2006-100703 | 4/2006 |
| JP | 4021472 B | 10/2007 |
| TW | 200718323 A | 5/2007 |
| TW | 200740331 A | 10/2007 |
| TW | 200820866 A | 5/2008 |
| TW | 200939925 A | 9/2009 |

OTHER PUBLICATIONS

U.S. Appl. No. 12/914,064, filed Oct. 28, 2010, Naganuma, et al.
U.S. Appl. No. 12/895,126, filed Sep. 30, 2010, Naganuma, et al.

* cited by examiner

*Primary Examiner* — Jeremy Norris
(74) *Attorney, Agent, or Firm* — Oblon, Spivak, McClelland, Maier & Neustadt, L.L.P.

(57) ABSTRACT

A flex-rigid wiring board having a flexible wiring board, a first insulation layer positioned adjacent to a side of the flexible board and having a first hole which penetrates through the first layer, a second insulation layer laminated over the flexible board and the first layer and having a second hole which penetrates through the second layer, the second hole of the second layer being formed along the axis of the first hole of the first layer, a first conductor structure formed in the first hole and including a filled conductor formed by filling plating in the first hole, and a second conductor structure formed in the second hole and including a filled conductor formed by filling plating in the second hole, the second conductor structure being formed along the axis of the first conductor structure and electrically connected to the first conductor structure.

21 Claims, 43 Drawing Sheets

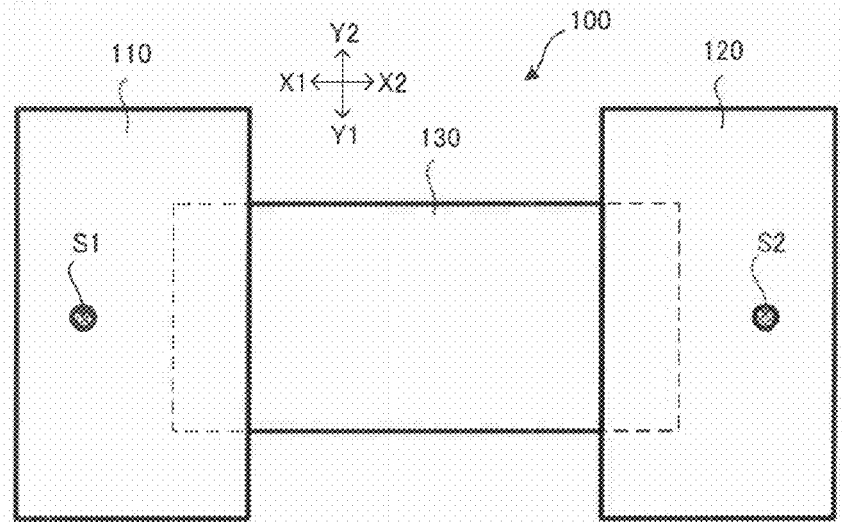
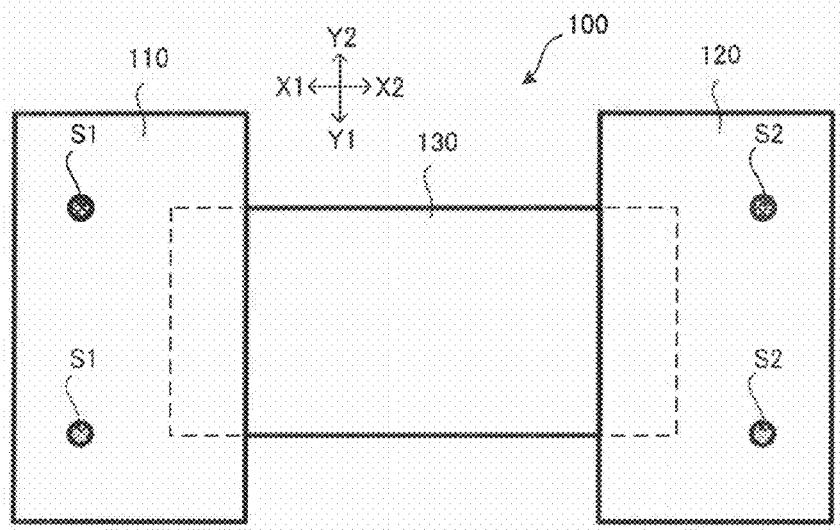

FLEX-RIGID WIRING BOARD AND METHOD FOR MANUFACTURING THE SAME

CROSS-REFERENCE TO RELATED APPLICATIONS

The present application claims the benefits of priority to U.S. application Ser. No. 61/297,412, filed Jan. 22, 2010. The contents of that application are incorporated herein by reference in their entirety.

BACKGROUND OF THE INVENTION

1. Field of the Invention

The present invention relates to a flex-rigid wiring board having a flexible section and a rigid section connected to each other, and to a method for manufacturing such a flex-rigid wiring board.

2. Discussion of the Background

In Japanese Patent Publication No. 4021472, a flex-rigid wiring board is described with wiring patterns on the upper and lower surfaces of a rigid section connected to each other by a conductor formed in a through hole. In Japanese Laid-Open Patent Publication No. H10-200258, a bendable multilayer printed wiring board is described. Such a multilayer printed wiring board is manufactured by laminating an insulative substrate, prepreg and a copper foil. The prepreg is made by impregnating aramid non-woven fabric with liquid resin. In a multilayer printed wiring board described in Japanese Laid-Open Patent Publication No. H10-200258, all layers are formed with insulation layers made by impregnating aramid non-woven fabric with resin. In Japanese Laid-Open Patent Publication Nos. 2005-322871 and 2006-100703, a flex-rigid wiring board is described in which a flexible section and a rigid section are electrically connected to each other by compressing and deforming conductive bumps. In Japanese Laid-Open Patent Publication No. 2005-353861, a flex-rigid wiring board is described in which a flexible section and a rigid section are electrically connected to each other by solder bumps which penetrate through an adhesive layer. In Japanese Laid-Open Patent Publication No. 2004-186235, a flex-rigid wiring board is described in which the laminated flexible section and rigid section are connected to each other by an adhesive agent.

The contents of Japanese Patent Publication No. 4021472, Japanese Laid-Open Patent Publication Nos. H10-200258, 2005-322871, 2006-100703, 2005-353861 and 2004-186235 are incorporated herein by reference in their entirety in the present application.

SUMMARY OF THE INVENTION

According to one aspect of the present invention, a flex-rigid wiring board has a flexible wiring board, a first insulation layer positioned adjacent to a side of the flexible wiring board and having a first hole which penetrates through the first insulation layer, a second insulation layer laminated over the flexible wiring board and the first insulation layer and having a second hole which penetrates through the second insulation layer, the second hole of the second insulation layer being formed along the axis of the first hole of the first insulation layer, a first conductor structure formed in the first hole of the first insulation layer and including a filled conductor formed by filling a plating in the first hole of the first insulation layer, and a second conductor structure formed in the second hole of the second insulation layer and including a filled conductor formed by filling a plating in the second hole of the second insulation layer, the second conductor structure being formed along the axis of the first conductor structure and electrically connected to the first conductor structure.

According to another aspect of the present invention, a method for manufacturing a flex-rigid wiring board includes preparing a flexible wiring board, preparing a first insulation layer having a first hole and a first conductor structure including a filled conductor formed by filing a plating in the first hole, preparing a second insulation layer having a second hole and a second conductor structure including a filled conductor formed by filling a plating in the second hole, preparing a third insulation layer having a third hole and a third conductor structure including a filled conductor formed by filling a plating in the third hole, forming a laminated body including the flexible wiring board, the first insulation layer, the second insulation layer and the third insulation such that the flexible wiring board and the first insulation layer are positioned side by side and the second insulation layer and the third insulation layer are sandwiching the first insulation layer and an end portion of the flexible wiring board and that the first conductor structure, the second conductor structure and the third conductor structure are positioned along an axis, and pressing and heating the laminated body such that the first conductor structure, the second conductor structure and the third conductor structure are set to be electrically continuous with each other.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2A is a plan view showing a first positioning of filled stacks;

FIG. 2B is a plan view showing a second positioning of filled stacks;

FIG. 35A is a view showing a first alternative example of a horizontal cross-sectional shape of a filled conductor or the like;

FIG. 35B is a view showing a second alternative example of a horizontal cross-sectional shape of a filled conductor or the like;

FIG. 35C is a view showing a third alternative example of a horizontal cross-sectional shape of a filled conductor or the like;

DETAILED DESCRIPTION OF THE EMBODIMENTS

Figure 1:
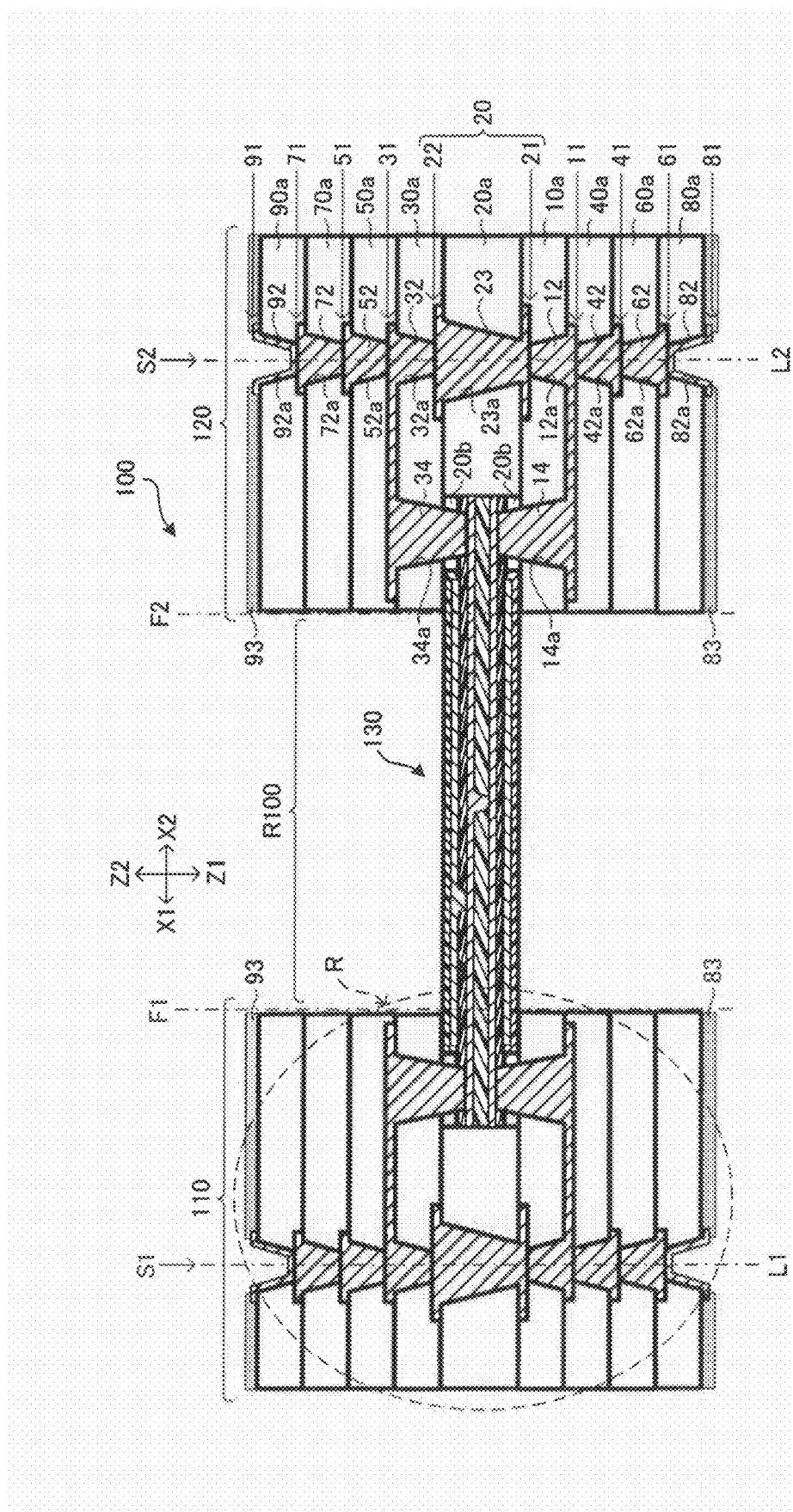
FIG. 1 is a cross-sectional view of a flex-rigid wiring board according to an embodiment of the present invention.

The embodiments will now be described with reference to the accompanying drawings, wherein like reference numerals designate corresponding or identical elements throughout the various drawings.

In the drawings, arrows (Z1, Z2) each indicate a lamination direction in a wiring board, corresponding to a direction along a normal line (or a direction of the thickness of a core substrate) to the main surfaces (upper and lower surfaces) of the wiring board. On the other hand, arrows (X1, X2) and (Y1, Y2) each indicate a direction perpendicular to a lamination direction (directions parallel to the main surfaces of the wiring board). The main surfaces of a wiring board are on the X-Y plane. Also, side surfaces of a wiring board are on the X-Z plane or the Y-Z plane.

Regarding filled conductors and their holes, a cross section perpendicular to directions Z (X-Y plane) is referred to as a horizontal cross section. Also, a cross section parallel to directions Z (X-Z plane or Y-Z plane) is referred to as a vertical cross section.

In the present embodiment, two main surfaces facing opposite directions of a normal line are referred to as a first surface (the Z1-side surface) and a second surface (the Z2-side surface). Namely, a main surface opposite the first surface is the second surface, and a main surface opposite the second surface is the first surface. In lamination directions, the side closer to the core is referred to as a lower layer (or the inner-layer side), and the side farther away from the core is referred to as an upper layer (or the outer-layer side).

Aside from a layer including a conductive pattern that functions as wiring such as circuits (including ground), a layer with only a plain pattern is also referred to as a wiring layer. Among the conductors formed inside holes, the conductive film formed on wall surfaces (side and bottom surfaces) of a hole is referred to as a conformal conductor, and the conductor filled in a hole is referred to as a filled conductor. Wiring layers may include the above conductive patterns along with lands of filled conductors.

Plating indicates depositing conductors (such as metal) to form layers on metal or resin surfaces and such deposited conductive layers (such as metal layers). Other than wet plating such as electrolytic plating and electroless plating, plating also includes dry plating such as PVD (Physical Vapor Deposition) and CVD (Chemical Vapor Deposition).

Unless specifically indicated, the "width" of a hole or a cylinder (protruding portion) indicates the diameter if it is a circle, and $2\sqrt{(\text{cross sectional area}/\pi)}$ if it is other than a circle. If a hole or a cylinder (protruding portion) tapers, whether "widths" in two or more holes or protruding portions are the same or not the same may be determined by comparing the values of corresponding portions, average values, or maximum values and the like. Regarding a line pattern formed on a surface, among the directions perpendicular to the line, the measurement in a direction parallel to the surface on which the line is formed is referred to as "width," and the measurement in a direction perpendicular to the surface on which the line is formed is referred to as "height" or "thickness." In addition, the measurement from one end of the line to the other end is referred to as "length." However, measurements are not limited to the above definitions if they are clearly indicated otherwise.

Flex-rigid wiring board 100 of the present embodiment is a printed wiring board. As shown in FIG. 1, flex-rigid wiring board 100 has rigid sections (110, 120) and flexible wiring board 130. Rigid section 110 and rigid section 120 are connected to each other by means of flexible wiring board 130.

Namely, rigid section 110 and rigid section 120 face each other by sandwiching flexible wiring board 130. Specifically, both ends of flexible wiring board 130 enter rigid sections (110, 120). Then, rigid sections (110, 120) and flexible wiring board 130 are connected to each other in the entered portions. In the drawing, boundary surface (F1) is the surface corresponding to the boundary between rigid section 110 and flexible section (R100), and boundary surface (F2) is the surface corresponding to the boundary between rigid section 120 and flexible section (R100). Also, flexible section (R100) is a flexible section sandwiched between rigid section 100 and rigid section 120, namely, part of flexible wiring board 130 exposed between boundary surface (F1) and boundary surface (F2).

Rigid sections (110, 120) have substrate 20, insulation layers (10*a*, 30*a*, 40*a*, 50*a*, 60*a*, 70*a*, 80*a*, 90*a*), wiring layers (11, 31, 41, 51, 61, 71, 81, 91), filled conductors (12, 32, 42, 52, 62, 72), conformal conductors (82, 92) and solder-resist layers (83, 93). Substrate 20 is positioned to a side of flexible wiring board 130 (direction X). Space may or may not exist between substrate 20 and flexible wiring board 130. However, alignment is easier if there is no space. Substrate 20 corresponds to the core section. Insulation layers and others positioned as upper layers to the core section correspond to built-up sections.

In rigid sections (110, 120), since filled conductor 23 (first conductor) of the core section (substrate 20), and filled conductors (12, 32, 42, 52, 62, 72) and conformal conductors (82, 92) in the built-up sections, are positioned along the same axes (along axis (L1), axis (L2)), filled stacks (S1, S2) extend in directions Z. Filled stacks (S1, S2) each electrically connect conductive patterns on both surfaces of rigid sections (110, 120) to each other, namely, wiring layer 81 on the first surface and wiring layer 91 on the second surface. The positions and the number of filled stacks (S1, S2) are not limited specifically. Filled stack (S1) or (S2) may be positioned one to each side (directions X) of flexible wiring board 130 as shown in FIG. 2A), for example, or may be positioned one at each of the four corners of flexible wiring board 130 as shown in FIG. 2B), for example. The number of filled stacks may be one (for details, see later-described FIGS. 28A-29C).

Substrate 20 (core substrate of flex-rigid wiring board 100) has insulation layer (20*a*) (first insulation layer), wiring layers (21, 22) and filled conductor 23. Hole (23*a*) which penetrates through insulation layer (20*a*) is formed in insulation layer (20*a*). Filled conductor 23 is formed by filling plating in hole (23*a*).

Insulation layer (20*a*) is made of epoxy resin, for example. Epoxy resin is preferred to contain a reinforcing material such as glass fiber (glass fabric or glass non-woven fabric, for example) or aramid fiber (aramid non-woven fabric, for example) impregnated with resin, for example. The reinforcing material has a smaller thermal expansion coefficient than the primary material (epoxy resin in the present embodiment).

Filled conductor 23 is made of copper plating, for example. The shape or the like of filled conductor 23 is described later.

Figure 3:
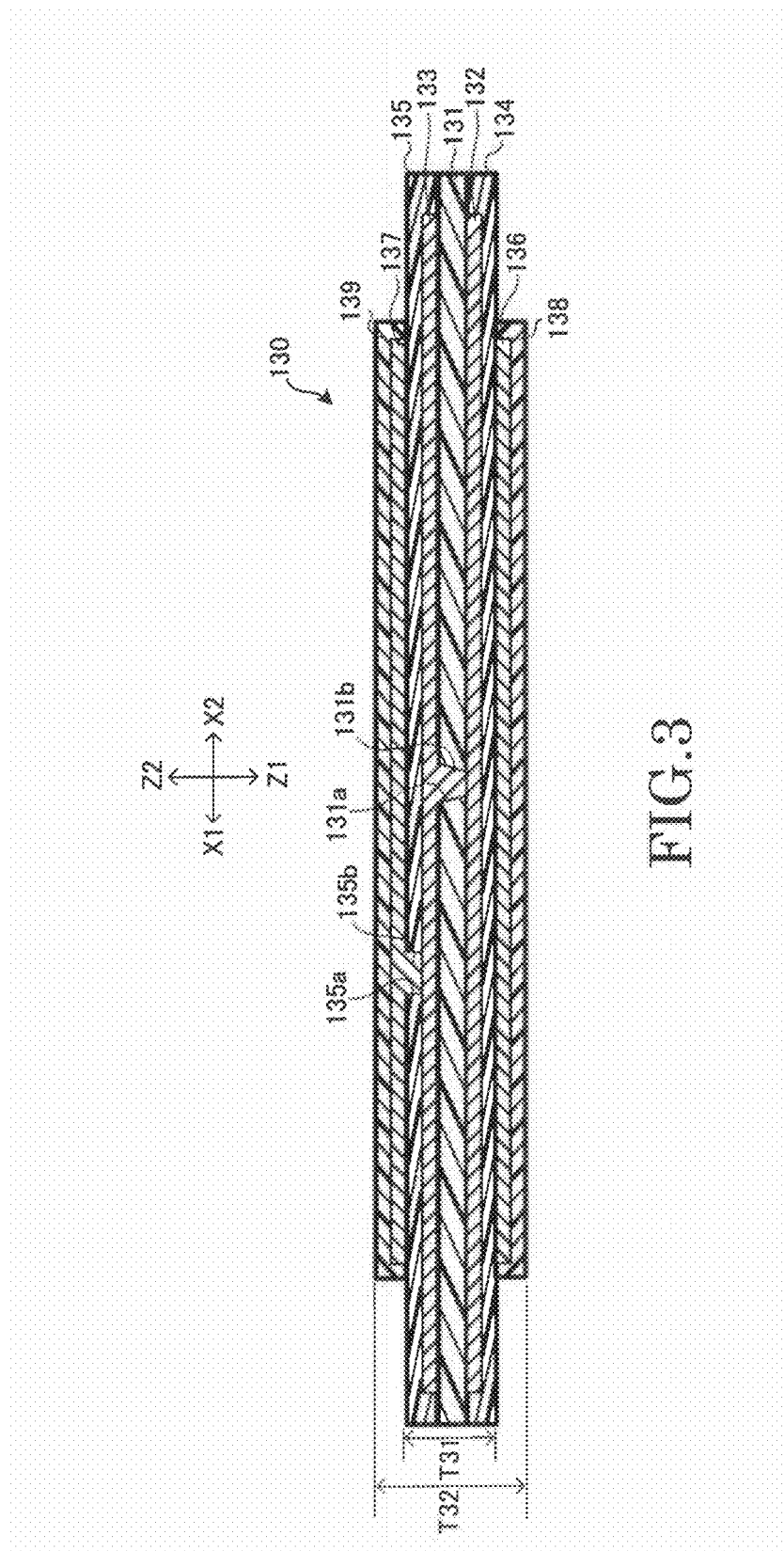
FIG. 3 is a cross-sectional view of a flexible wiring board.

As shown in FIG. 3, for example, flexible wiring board 130 has flexible substrate 131 (core substrate of flexible wiring board 130), wiring layers (132, 133), inner coverlays (134, 135), shield layers (136, 137) and outer coverlays (138, 139). Thickness (T31) at the ends of flexible wiring board 130 is 100 μm, for example. Thickness (T32) at the central section of flexible wiring board 130 is approximately 150 μm, for example.

Flexible substrate 131 is made of insulative polyimide or liquid-crystal polymer, for example. The thickness of flexible substrate 131 is 20-50 μm, for example, preferably approximately 25 μm.

Wiring layer 132 (first conductive pattern) is formed on the first surface of flexible substrate 131, and wiring layer 133 (second conductive pattern) is formed on the second surface of flexible substrate 131. Wiring layers (132, 133) include striped wiring that connects wiring in rigid section 110 and wiring in rigid section 120 to each other, for example. Wiring layers (132, 133) are made of copper, for example.

Inner coverlays (134, 135) are formed on flexible substrate 131. Inner coverlays (134, 135) coat wiring layers (132, 133) respectively and insulate them from the outside. Inner coverlays (134, 135) are made of polyimide, for example. The thickness of inner coverlays (134, 135) is approximately 5-30 μm, for example.

Shield layer 136 is formed on inner coverlay 134, and shield layer 137 is formed on inner coverlay 135. Shield layers (136, 137) shield electromagnetic noise from the outside to wiring layers (132, 133), as well as shield electromagnetic noise from wiring layers (132, 133) to the outside. Shield layers (136, 137) are made of conductive paste, for example. The thickness of shield layers (136, 137) is approximately 10-30 μm, for example. Also, it is acceptable to form shield layer 136 or 137 only on one surface.

The conductive paste forming shield layers (136, 137) contains fine silver particles, for example. Conductive paste is preferred to contain at least one kind from among silver, gold, copper and carbon. Especially, since silver has high electrical conductivity, it is effective to reduce noise. However, the material for shield layers (136, 137) is not limited to the above, and any other type may also be used.

Flexible substrate 131 has filled conductor (131*b*). In particular, hole (131*a*) is formed in flexible substrate 131. Filled conductor (131*b*) is formed by filling plating in hole (131*a*). Wiring layer 132 and wiring layer 133 are electrically connected by means of filled conductor (131*b*).

In addition, inner coverlay 135 has filled conductor (135*b*). In particular, hole (135*a*) is formed in inner coverlay 135. Filled conductor (135*b*) is formed by filling conductive paste in hole (135*a*). Shield layer 137 and wiring layer 133 are electrically connected by means of filled conductor (135*b*).

Outer coverlay 138 is formed over inner coverlay 134, and outer coverlay 139 is formed over inner coverlay 135. Outer coverlay 138 coats shield layer 136 and outer coverlay 139 coats shield layer 137. Outer coverlays (138, 139) insulate and protect entire flexible wiring board 130 from the outside. Outer coverlays (138, 139) are made of polyimide, for example. The thickness of outer coverlays (138, 139) is approximately 5-30 μm, for example.

Insulation layer (10*a*) (second insulation layer) is laminated on the first-surface side of an end portion of flexible wiring board 130 and of insulation layer (20*a*). Specifically, insulation layer (10*a*) in rigid section 110 is laminated on the first surface of the X1-side end portion of flexible wiring board 130, and insulation layer (10*a*) in rigid section 120 is laminated on the first surface of the X2-side end portion of flexible wiring board 130. Also, insulation layer (30*a*) (third insulation layer) is laminated on the first-surface side of the end portion of flexible wiring board 130 and of insulation layer (20*a*). Specifically, insulation layer (30*a*) in rigid section 110 is laminated on the second surface of the X1-side end portion of flexible wiring board 130, and insulation layer (30*a*) in rigid section 120 is laminated on the second surface of the X2-side end portion of flexible wiring board 130.

Figure 4:
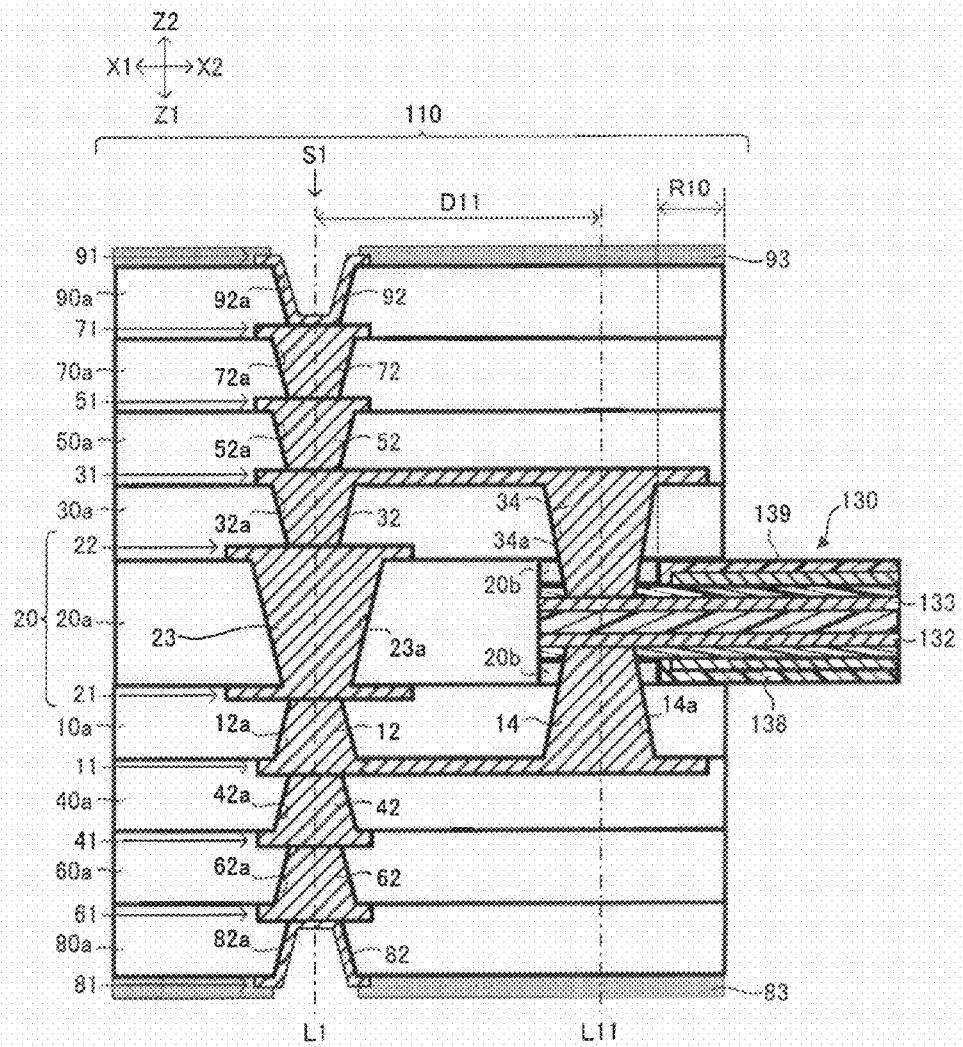
FIG. 4 is a magnified cross-sectional view showing part of a region in FIG. 1.

FIG. 4 is a magnified view of region "R" in FIG. 1 (connection section between rigid section 110 and flexible wiring board 130). The structure of the connection section between rigid section 120 and flexible wiring board 130 is the same as the structure of the connection section between rigid section 110 and flexible wiring board 130. Hereinafter, the connection sections between flexible wiring board 130 and rigid sections (110, 120) are referred to as F-R connection sections.

As shown in FIG. 4, flexible wiring board 130 is positioned to a side of insulation layer (20a) (direction X). The thickness of insulation layer (20a) and the thickness of flexible wiring board 130 are set to be substantially the same. In the space partitioned by flexible wiring board 130 and insulation layers (10a, 20a, 30a) (the clearance among such members), resin (20b) is filled. Resin (20b) is flowed from the surrounding insulation layers (such as insulation layer (20a)) by pressing, for example, and is cured to be integrated with the surrounding insulation layers. Insulation layer (10a) and insulation layer (30a) sandwich the end portion of flexible wiring board 130 and are laminated and connected to outer coverlays (138, 139) in region (R10).

As described previously, filled conductor 14 (connection conductor) is formed in insulation layer (10a), and filled conductor 34 (connection conductor) is formed in insulation layer (30a). Filled conductors (14, 34) are formed by filling plating in holes (14a, 34a) respectively. Filled conductor 14 is connected to both wiring layer 132 and wiring layer 11, and filled conductor 34 is connected to both wiring layer 133 and wiring layer 31. Filled conductor 14 is electrically connected to the land of filled conductor 12 (second conductor) by means of a conductive pattern included in wiring layer 11. Also, filled conductor 34 is electrically connected to the land of filled conductor 32 (third conductor) by means of a conductive pattern included in wiring layer 31.

In flex-rigid wiring board 100 of the present embodiment, rigid sections (110, 120) and flexible wiring board 130 are electrically connected without using connectors. Thus, even if the impact of being dropped or the like is received, connection failure due to detached connectors does not occur.

By the end portions of flexible wiring board 130 entered (embedded) into rigid sections (110, 120) respectively, rigid section 110 and rigid section 120 are electrically connected at the entered portions (embedded portions). Accordingly, their connections are strong.

As shown in FIG. 1, insulation layer (40a) is laminated on the first-surface side of insulation layer (10a), and insulation layer (50a) is laminated on the second-surface side of insulation layer (30a). Wiring layer 41 is formed on the first surface of insulation layer (40a), and wiring layer 51 is formed on the second surface of insulation layer (50a). Insulation layer (60a) is laminated on the first-surface side of insulation layer (40a), and insulation layer (70a) is laminated on the second-surface side of insulation layer (50a). Wiring layer 61 is formed on the first surface of insulation layer (60a), and wiring layer 71 is formed on the second surface of insulation layer (70a). Insulation layer (80a) is laminated on the first-surface side of insulation layer (60a), and insulation layer (90a) is laminated on the second-surface side of insulation layer (70a). Wiring layer 81 is formed on the first surface of insulation layer (80a), and wiring layer 91 is formed on the second surface of insulation layer (90a).

Insulation layers (10a, 30a, 40a, 50a, 60a, 70a, 80a, 90a) correspond to interlayer insulation layers. In such insulation layers (10a, 30a-90a), holes (12a, 32a, 42a, 52a, 62a, 72a, 82a, 92a) which penetrate through their respective insulation layers are formed.

Insulation layers (10a, 30a-90a) have filled conductors (12, 32, 42, 52, 62, 72) and conformal conductors (82, 92). Filled conductors (12, 32-72) are formed by filling plating in holes (12a, 32a-72a) respectively. Conformal conductors (82, 92) are formed by forming plating on the wall surfaces of holes (82a, 92a) respectively.

Wiring layers (11, 31-91) are made of copper foil or copper plating, for example. Also, as the material for insulation layers (10a, 30a-90a), the following may be used: those made by impregnating base material such as glass fabric or aramid fabric with resins such as epoxy resin, polyester resin, bismaleimide triazine resin (BT resin), imide resin (polyimide), phenol resin, or allyl polyphenylene ether resin (A-PPE resin).

Filled conductors (12, 32-72) and conformal conductors (82, 92) are made of copper plating, for example. Filled conductors (12, 32-72) and holes (82a, 92a) in which conformal conductors (82, 92) are formed are formed to be tapered cylinders, for example.

Along axis (L1) and axis (L2), conformal conductor 82, filled conductors (62, 42, 12, 23, 32, 52, 72) and conformal conductor 92 are laminated in that order from the first-surface side toward the second-surface side. Adjacent filled conductors are adhered to (touching) each other and become electrically continuous with each other. Filled stack (S1) is formed along axis (L1), and filled stack (S2) is formed along axis (L2). Filled stacks (S1, S2) each have a structure where interlayer connections (filled conductors or conformal conductors) throughout the layers are arranged on the same axis, a so-called full stack structure. Such a full stack structure is not always required (see later-described FIGS. 32, 33).

Figure 5A:
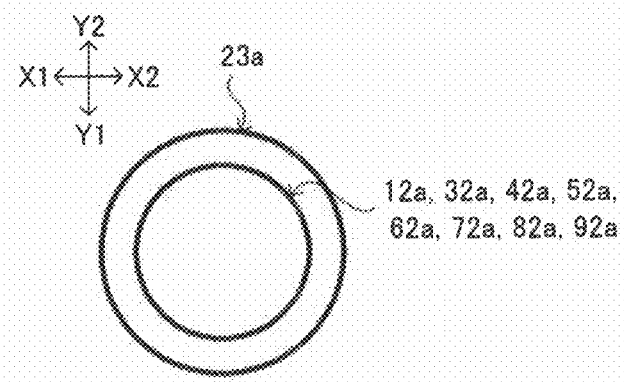
FIG. 5A is a plan view to illustrate positioning and shapes of holes relating to interlayer connections.
Figure 5B:
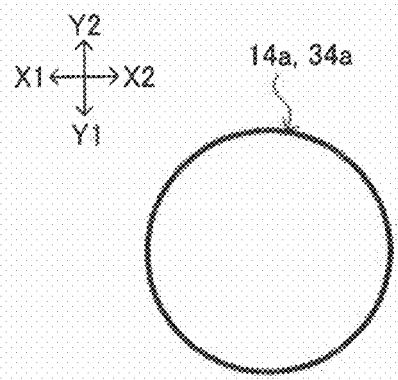
FIG. 5B is a plan view to illustrate positioning and shapes of holes at an F-R connection section.

As shown in FIGS. 4, 5A and 5B, filled conductor 32 (or hole (32a)), filled conductor 34 (or hole (34a)) and filled conductor 23 (or hole (23a)) are formed to be tapered cylinders, widening from the first-surface side toward the second-surface side. Filled conductor 12 (or hole (12a)) and filled conductor 14 (or hole (14a)) are formed to be tapered cylinders, widening from the second-surface side toward the first-surface side. However, shapes of filled conductors 23 and others are not limited to the above, and any other type may also be employed (see later-described FIGS. 35A-38).

As shown in FIG. 4, filled stack (S1) is arranged along the same axis (axis (L1)), and filled conductors (14, 34) are arranged along the same axis (axis (L11)). Distance (D11) between filled stack (S1) and filled conductors (14, 34) (F-R connection section) is preferred to be set at 875 μm or less.

As shown in FIG. 5A, holes (12a, 23a, 32a, 42a, 52a, 62a, 72a, 82a, 92a) relating to interlayer connections are positioned to be concentric circles in the present embodiment. In doing so, an increase in contact areas and a decrease in wiring lengths are achieved. As a result, excellent electrical characteristics are obtained. However, it is not always required for the centers of such circles to overlap (see later-described FIGS. 31-33).

As shown in FIG. 5B, holes (14a, 34a) at the F-R connection section are arranged to be concentric circles in the present embodiment. Moreover, their shapes are the same as each other. However, it is not always required for the centers of circles to overlap and their shapes to be the same.

Flex-rigid wiring board 100 of the present embodiment has filled conductor 23 formed by filling plating in hole (21a) which penetrates through insulation layer (20a), and filled conductor 12 (or filled conductor 32) formed by filling plating in hole (12a) (or hole (32a)) which penetrates through insulation layer (10a) (or insulation layer (30a)). Then, filled conductor 23 and filled conductor 12 (or filled conductor 32) are positioned along the same axis and are electrically continuous with each other. In doing so, the F-R connection section is strengthened. Accordingly, even if flexible section (R100) is bent and great force is exerted on the F-R connection section, it is thought that the connection section has tolerance to such force. Also, it is thought that securing wiring space becomes easier and design flexibility of wiring patterns increases. In addition, since wiring in directions X or directions Y may be omitted, it is thought that wiring lengths in interlayer connections are reduced.

Moreover, conductors relating to interlayer connections, namely, conformal conductor 82, filled conductors (62, 42, 12, 23, 32, 52, 72) and conformal conductor 92 make a full stack structure. Thus, it is thought that even a greater effect is achieved.

In flex-rigid wiring board 100 of the present embodiment, conductive patterns (wiring layers 132, 133) in flexible wiring board 130 and conductive patterns (wiring layers 11, 32) in rigid sections (110, 120) are electrically connected to each other by filled conductors (14, 34). Therefore, the strength at the F-R connection sections increases compared with cases where vias are not used for connection or where conformal conductors are used for connection.

Figure 6:
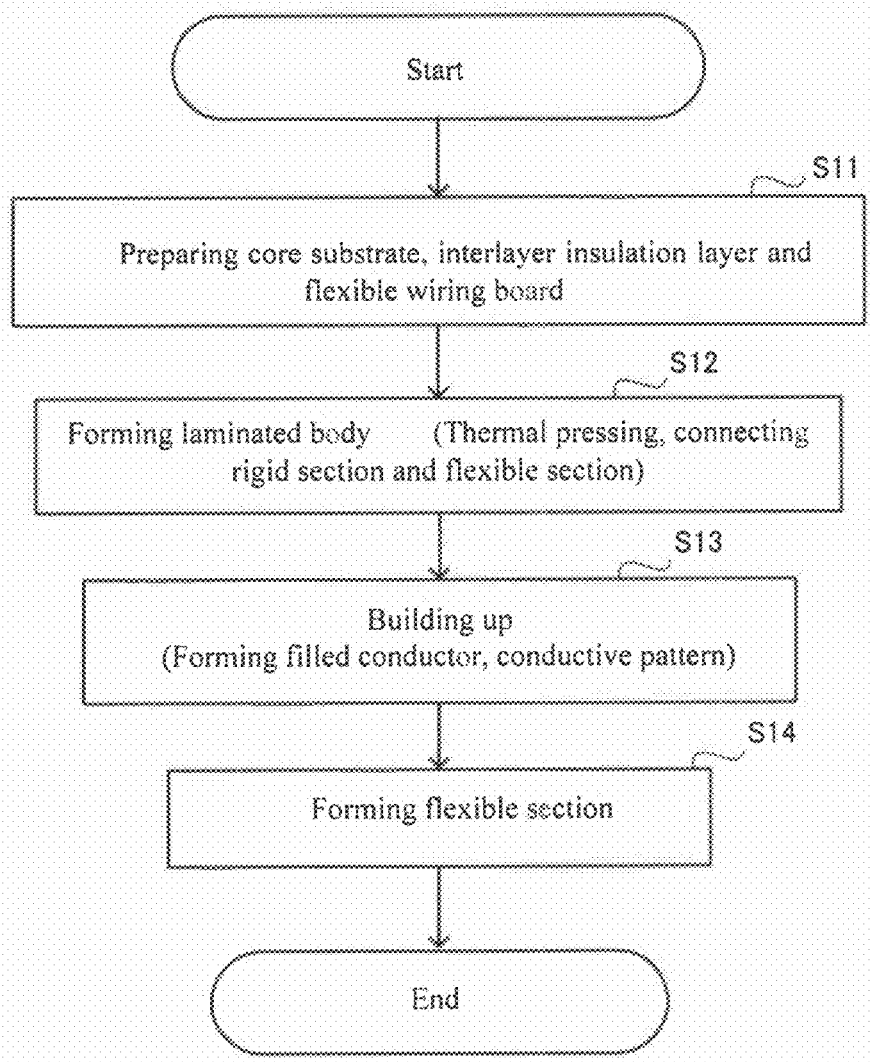
FIG. 6 is a flowchart showing a method for manufacturing a flex-rigid wiring board according to an embodiment of the present invention.

Above flex-rigid wiring board 100 is manufactured by the procedure as shown in FIG. 6, for example.

In step (S11), substrate 20 (core substrate), insulation layers (10a, 30a) (interlayer insulation layers) and flexible wiring board 130 are prepared.

FIGS. 7A-7D show a method for manufacturing substrate 20.

Figure 7A:
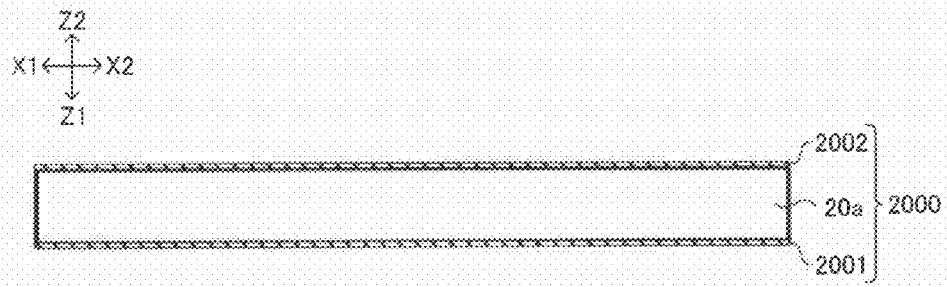
FIG. 7A is a view to illustrate a first step of a method for manufacturing a core substrate.

First, as shown in FIG. 7A, double-sided copper-clad laminate 2000 (starting material) is prepared. Double-sided copper-clad laminate 2000 has insulation layer (20a) and copper foils (2001, 2002). Copper foil 2001 is formed on the first surface of insulation layer (20a) and copper foil 2002 is formed on the second surface of insulation layer (20a). As described previously, the material for insulation layer (20a) is epoxy resin containing reinforcing material, for example.

Figure 7B:
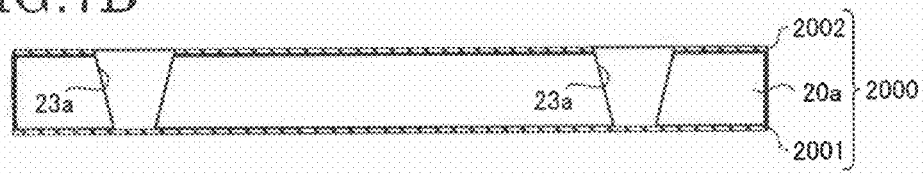
FIG. 7B is a view to illustrate a second step subsequent to the step in FIG. 7A.

Next, as shown in FIG. 7B, holes (23a) are formed in insulation layer (20a) using a laser, for example. Holes (23a) penetrate through copper foil 2002 and insulation layer (20a), but do not penetrate through copper foil 2001. After that, desmearing and soft etching are conducted, if required.

Figure 7C:
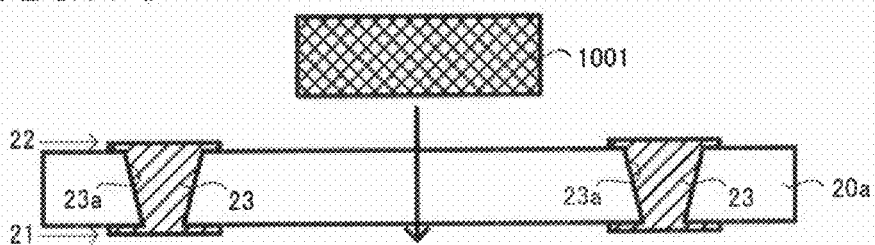
FIG. 7C is a view to illustrate a third step subsequent to the step in FIG. 7B.
Figure 7D:
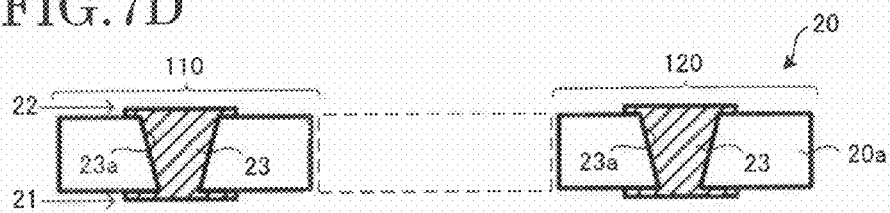
FIG. 7D is a view to illustrate a fourth step subsequent to the step in FIG. 7C.

Next, as shown in FIG. 7C, blanking is performed in insulation layer (20a) using die 1001. Accordingly, as shown in FIG. 7D, insulation layer (20a) is separated into rigid section 110 and rigid section 120. As a result, substrate 20 is completed.

Figure 8:
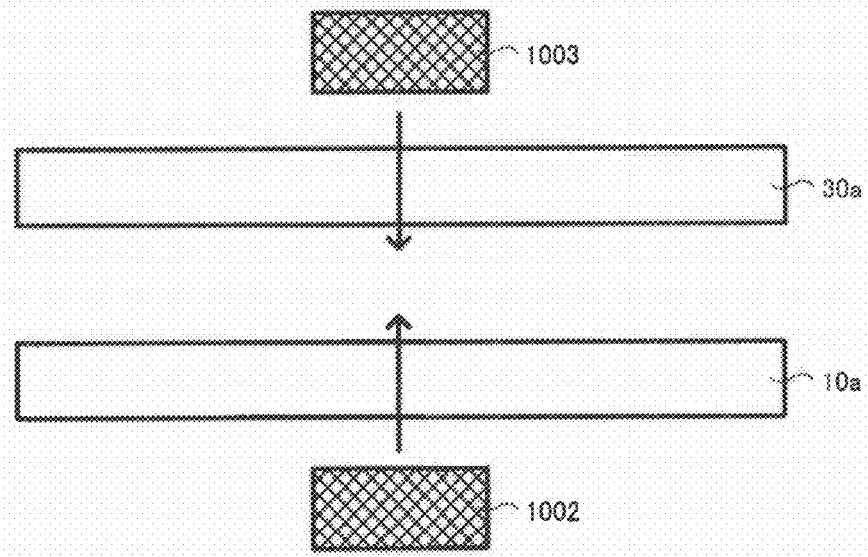
FIG. 8 is a view to illustrate a first step of a method for processing interlayer insulation layers.
Figure 9:
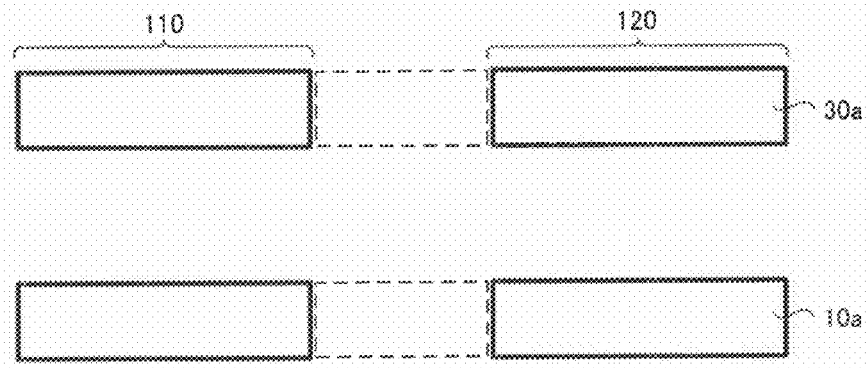
FIG. 9 is a view to illustrate a second step subsequent to the step in FIG. 8.

FIGS. 8 and 9 show a method for processing insulation layers (10a, 30a).

First, as shown in FIG. 8, insulation layers (10a, 30a) prior to processing are prepared. As described previously, the material for insulation layers (10a, 30a) is the following: those made by impregnating base material such as glass fabric or aramid fabric with resins such as epoxy resin, polyester resin, bismaleimide triazine resin (BT resin), imide resin (polyimide), phenol resin, or allyl polyphenylene ether resin (A-PPE resin). At this stage, insulation layers (10a, 30a) are in a prepreg state (semi-cured adhesive sheet). However, instead of prepreg, RCF (resin-coated copper foil) or the like may also be used.

Next, blanking insulation layer (10a) is performed using die 1002, and blanking insulation layer (30a) is performed using die 1003. Accordingly, as shown in FIG. 9, insulation layers (10a, 30a) are each separated into rigid section 110 and rigid section 120.

FIGS. 10A-12 show a method for manufacturing flexible wiring board 130. In the present embodiment, multiple flexible wiring boards 130 are simultaneously manufactured in a single manufacturing panel, and one of them is separated in a step in FIG. 12. However, manufacturing flexible wiring boards 130 is not limited to such, and one flexible wiring board 130 may be formed using a single manufacturing panel.

Figure 10A:
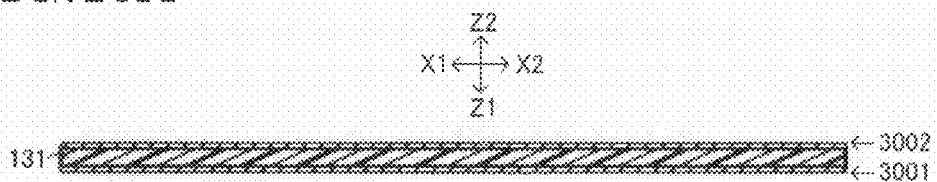
FIG. 10A is a view to illustrate a first step of a method for manufacturing a flexible wiring board.

First, as shown in FIG. 10A, a double-sided copper-clad laminate (starting material) is prepared. Such a double-sided copper-clad laminate has flexible substrate 131 and copper foils (3001, 3002). Copper foil 3001 is formed on the first surface of flexible substrate 131, and copper foil 3002 is formed on the second surface of flexible substrate 131. As described previously, the material for flexible substrate 131 is, for example, insulative polyimide or liquid-crystal polymer. The thickness of copper foils (3001, 3002) is 18 μm, for example.

Figure 10B:
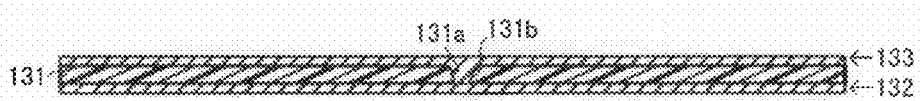
FIG. 10B is a view to illustrate a second step subsequent to the step in FIG. 10A.

Next, as shown in FIG. 10B, wiring layers (132, 133) and filled conductor (131b) are formed.

In particular, to begin with, hole (131a) is formed in flexible substrate 131 using a laser, for example. Hole (131a) penetrates through flexible substrate 131 and reaches copper foil 3001. Then, desmearing and soft etching are conducted if required.

Next, plating (such as electroless plating and electrolytic plating) is filled in hole (131a) by copper panel plating (plating in hole (131a) and on the entire surface). Accordingly, filled conductor (131b) is formed.

Next, conductive layers on both surfaces of flexible substrate 131 are patterned using a lithographic technique. Accordingly, wiring layer 132 is formed on the first surface of flexible substrate 131, and wiring layer 133 is formed on the second surface of flexible substrate 131. Furthermore, if required, a horizontal roughening process is carried out.

Figure 10C:
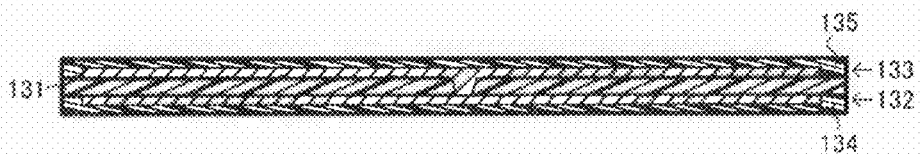
FIG. 10C is a view to illustrate a third step subsequent to the step in FIG. 10B.

Next, as shown in FIG. 10C, by pressing, for example, inner coverlay 134 is attached to the first-surface side of flexible substrate 131, and inner coverlay 135 is attached to the second-surface side of flexible substrate 131. Accordingly, wiring layers (132, 133) are coated with inner coverlays (134, 135) respectively.

Figure 10D:
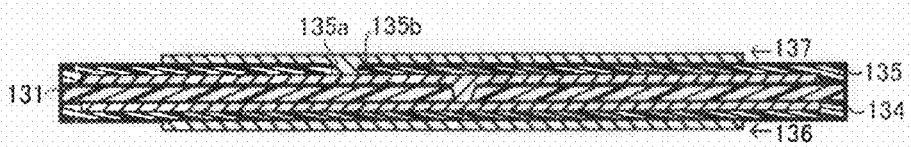
FIG. 10D is a view to illustrate a fourth step subsequent to the step in FIG. 10C.

Next, as shown in FIG. 10D, shield layers (136, 137) are formed. In particular, hole (135a) is formed in inner coverlay 135 using a laser, for example. Next, conductive paste (such as silver paste) is printed on the surfaces of inner coverlays (134, 135). Accordingly, shield layer 136 is formed on inner coverlay 134, and shield layer 137 is formed on inner coverlay 135. Also, filled conductor (135b) is formed in inner coverlay 135.

Figure 10E:
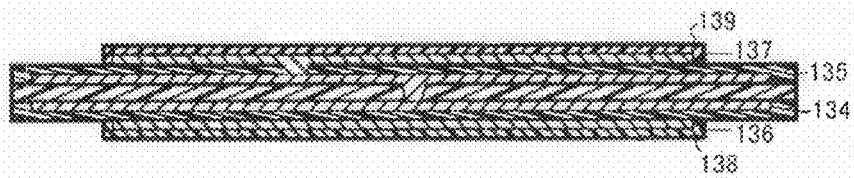
FIG. 10E is a view to illustrate a fifth step subsequent to the step in FIG. 10D.

Next, as shown in FIG. 10E, by pressing, for example, outer coverlay 138 is attached to the first-surface side of inner coverlay 134, and outer coverlay 139 is attached to the second surface-side of inner coverlay 135. Accordingly, shield layers (136, 137) are coated with outer coverlays (138, 139) respectively. As a result, multiple flexible wiring boards 130 are manufactured. After that, if required, jig holes are formed and electrolytic gold plating is performed.

Figure 11:
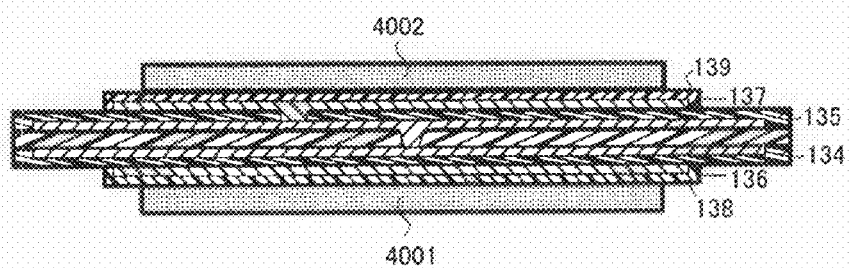
FIG. 11 is a view to illustrate a sixth step subsequent to the step in FIG. 10E.

Next, as shown in FIG. 11, by printing, for example, strip mask 4001 is formed on the first-surface side of outer coverlay 138, and strip mask 4002 is formed on the second-surface side of outer coverlay 139.

Figure 12:
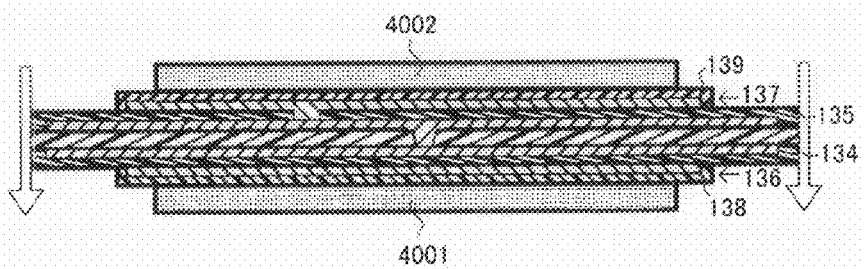
FIG. 12 is a view to illustrate a seventh step subsequent to the step in FIG. 11.

Next, as shown in FIG. 12, using a die, for example, one flexible wiring board 130 is pulled out. Accordingly, flexible wiring board 130 previously shown in FIG. 3 is obtained. The method for separating flexible wiring board 130 is not limited to using a die, and any other method may also be employed.

For example, it may be separated using a laser or a drill.

Next, in step (S12) of FIG. 6, a laminated body is formed using substrate 20 (core substrate), insulation layers (10a, 30a) (interlayer insulation layers) and flexible wiring board 130.

Figure 13:
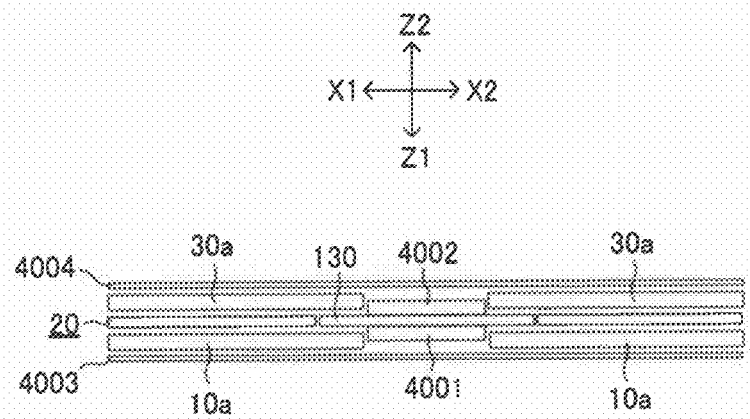
FIG. 13 is a view to illustrate a first step for forming a laminated body.

In particular, to begin with, substrate 20 (FIG. 7D), insulation layers (10a, 30a) (FIG. 9), flexible wiring board 130 (FIG. 12) and copper foils (4003, 4004) are aligned and positioned as shown in FIG. 13, for example. Substrate 20 is positioned to the sides (directions X) of flexible wiring board 130. Insulation layer (10a) is positioned to the sides (directions X) of strip mask 4001, and insulation layer (30a) is positioned to the sides (directions X) of strip mask 4002. Both end portions of flexible wiring board 130 are sandwiched by insulation layers (10a, 30a). Copper foils (4003, 4004) are positioned outermost (first-surface side, second-surface side).

Figure 14:
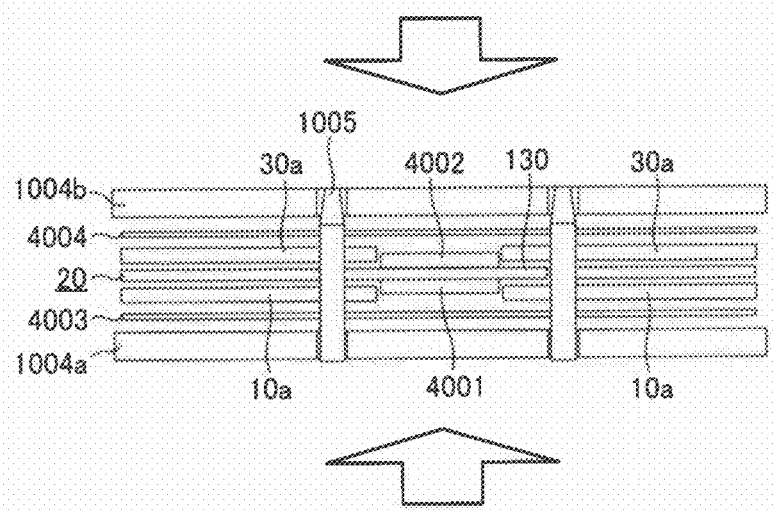
FIG. 14 is a view to illustrate a second step subsequent to the step in FIG. 13.

Next, the members as aligned above are sandwiched by pressing jigs (1004a, 1004b) as shown in FIG. 14, for example, and thermal pressed all at once. Namely, pressing and heating are conducted simultaneously. During that time, jigs (1004a, 1004b) are aligned using pins 1005. By doing so, pressure is exerted substantially perpendicular to the main surfaces.

Figure 15:
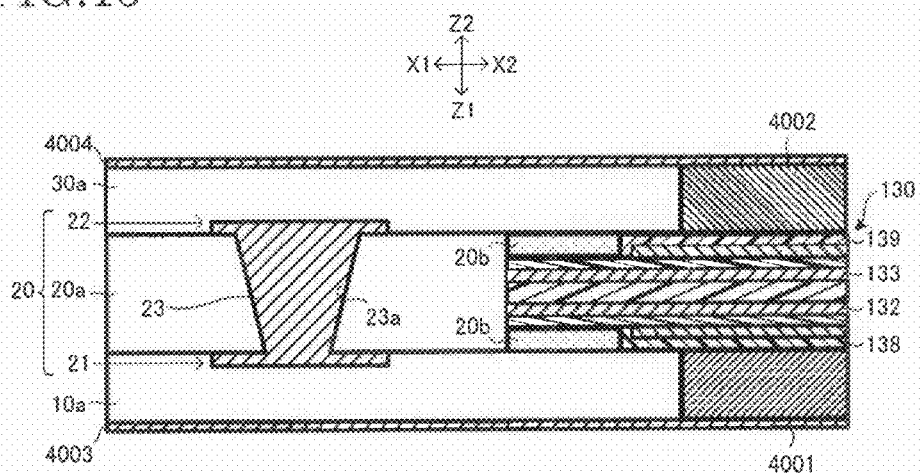
FIG. 15 is a view to illustrate a third step subsequent to the step in FIG. 14.

As shown in FIG. 15, resin (20b) is squeezed out from the surrounding insulation layers (insulation layers (10a, 20a, 30a)) by the above pressing, and resin (20b) is filled in the space between insulation layer (20a) and flexible wiring board 130. Also, by the above heating, prepreg (insulation layers (10a, 30a)) is cured, and insulation layer (20a) and insulation layers (10a, 30a) are adhered. Also, insulation layers (10a, 30a) and flexible wiring board 130 are bonded as well. The above pressing and heating may be divided into multiple procedures. Also, heating and pressing may be conducted separately, but it is more efficient if they are conducted simultaneously. After the thermal pressing, another heating may be conducted separately to integrate the above members.

Figure 16:
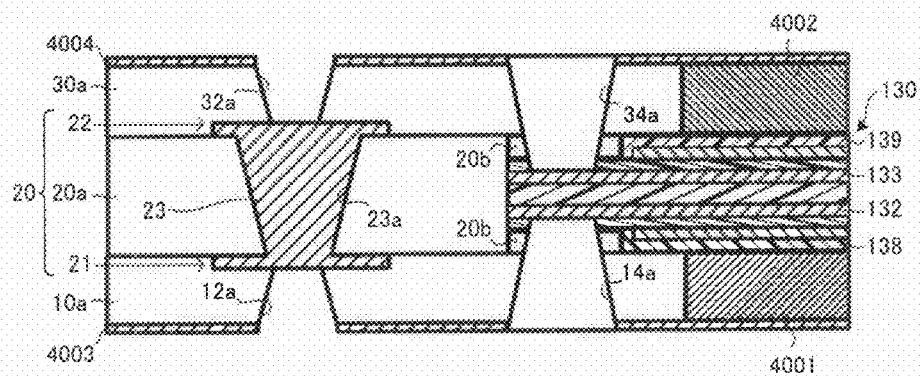
FIG. 16 is a view to illustrate a fourth step subsequent to the step in FIG. 15.

Next, as shown in FIG. 16, holes (12a, 14a) are formed in insulation layer (10a) and holes (32a, 34a) are formed in insulation layer (30a) by using a laser, for example. Hole (12a) reaches the first-surface side land of filled conductor 23 (wiring layer 21), and hole (32a) reaches the second-surface side land of filled conductor 23 (wiring layer 22). Also, hole (14a) reaches wiring layer 132 and hole (34a) reaches wiring layer 133. After that, desmearing and soft etching are conducted if required.

Figure 17:
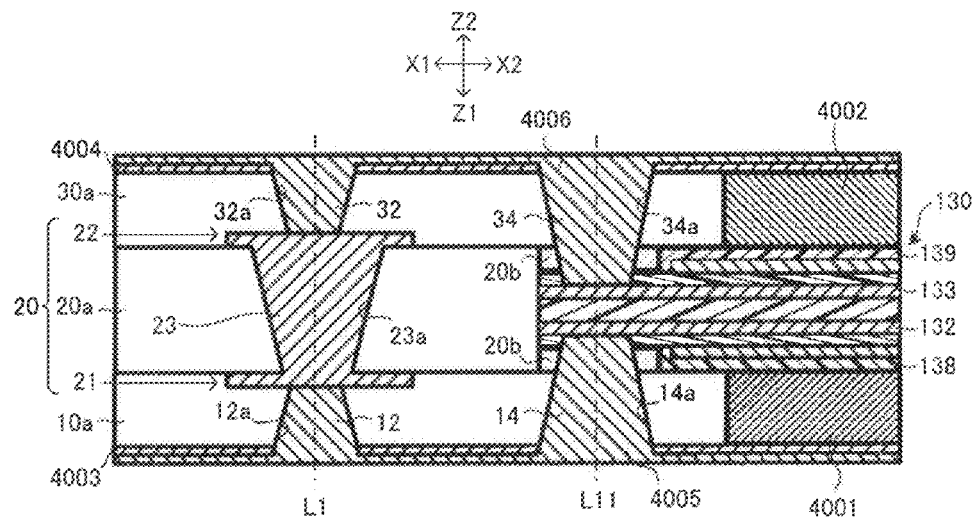
FIG. 17 is a view to illustrate a fifth step subsequent to the step in FIG. 16.

Next, as shown in FIG. 17, by performing copper panel plating (such as either electroless plating or electrolytic plating, or both), plating 4005 is filled in holes (12a, 14a) and plating 4006 is filled in holes (32a, 34a). Accordingly, filled conductors (12, 14, 32, 34) are formed. Filled conductors (12, 23, 32) are positioned along the same axis (axis L1) and become electrically continuous to each other. Also, filled conductors (14, 34) are positioned along the same axis (axis L11) as well. Filled conductor 14 is bonded to wiring layer 132, and filled conductor 34 is bonded to wiring layer 133.

Figure 18:
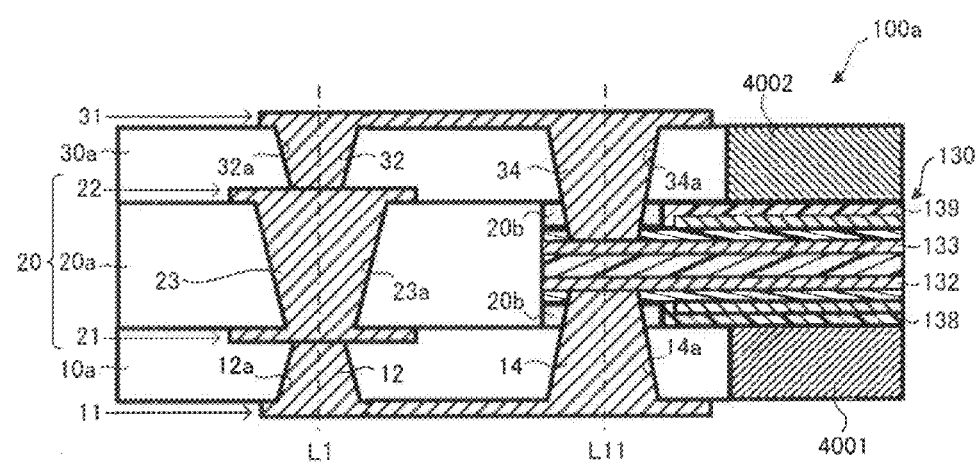
FIG. 18 is a view to illustrate a sixth step subsequent to the step in FIG. 17.

Furthermore, conductive layers on both surfaces are patterned by a lithographic technique, for example. Accordingly, as shown in FIG. 18, wiring layer 11 is formed on insulation layer (10a) and wiring layer 31 is formed on insulation layer (30a).

Accordingly, laminated body (100a) is formed with substrate 20, insulation layers (10a, 30a) and flexible wiring board 130. Insulation layer (20a) is sandwiched between insulation layer (10a) and insulation layer (30a).

Next, in step (S13) of FIG. 6, building up is carried out on laminated body (100a).

Figure 19:
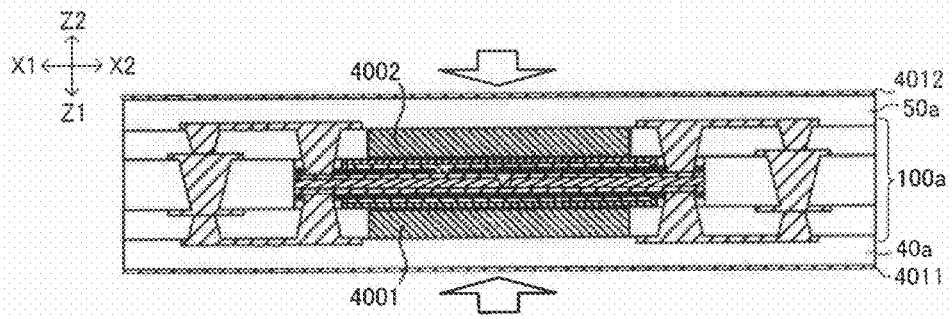
FIG. 19 is a view to illustrate a first step for building up on the laminated body (core section)

In particular, first, as shown in FIG. 19, copper foil 4011, insulation layer (40a), laminated body (100a), insulation layer (50a) and copper foil 4012 are positioned so as to be laminated in that order. Accordingly, laminated body (100a) is sandwiched by insulation layer (40a) and insulation layer (50a). At this stage, insulation layers (40a, 50a) are in a prepreg state (semi-cured adhesive sheet). However, instead of prepreg, RCF (resin-coated copper foil) or the like may also be used.

Next, thermal pressing is conducted. Accordingly, prepreg (insulation layers (40a, 50a)) is cured, and copper foil 4011, insulation layer (40a), laminated body (100a), insulation layer (50a) and copper foil 4012 are integrated.

Figure 20:
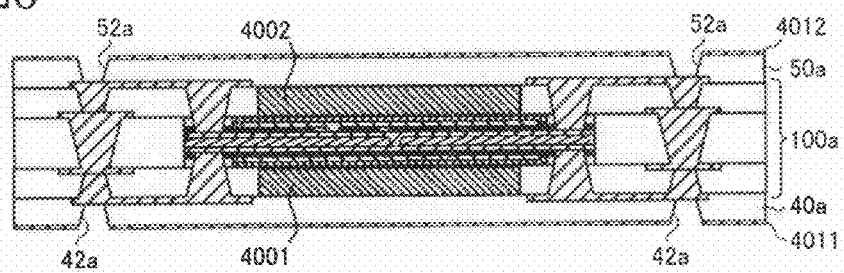
FIG. 20 is a view to illustrate a second step subsequent to the step in FIG. 19.

Next, as shown in FIG. 20, holes (42a) are formed in insulation layer (40a) and holes (52a) are formed in insulation layer (50a) by using a laser, for example. After that, desmearing and soft etching are conducted if required.

Figure 21:
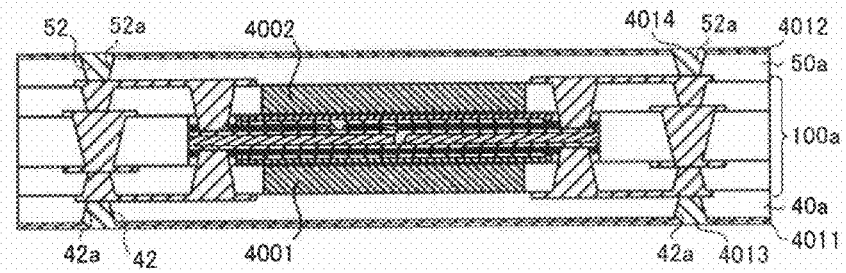
FIG. 21 is a view to illustrate a third step subsequent to the step in FIG. 20.

Next, as shown in FIG. 21, plating 4013 is filled in holes (42a) and plating 4014 is filled in holes (52a) by performing copper panel plating (such as either electroless plating or electrolytic plating, or both), for example. Accordingly, filled conductors (42, 52) (fourth conductors) are formed. Filled conductors (42, 52) are positioned along the same axes (axis (L1) and axis (L2)) as filled conductor 12, filled conductor 23 and filled conductor 32 (see FIG. 1).

Figure 22:
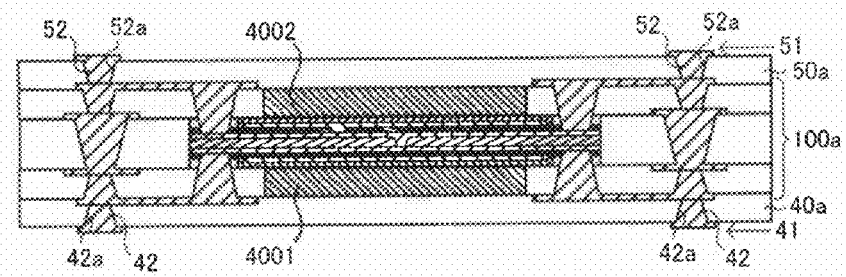
FIG. 22 is a view to illustrate a fourth step subsequent to the step in FIG. 21.

Furthermore, the conductive layers on both surfaces are patterned by a lithographic technique, for example. Accordingly, as shown in FIG. 22, wiring layer 41 is formed on insulation layer (40a) and wiring layer 51 is formed on insulation layer (50a).

Figure 23:
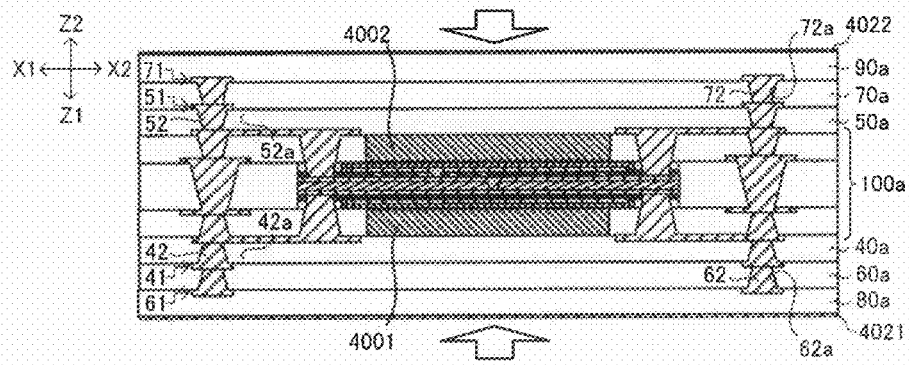
FIG. 23 is a view to illustrate a fifth step subsequent to the step in FIG. 22.

Then, wiring layers (61, 71) and filled conductors (62, 72) are formed through the same procedures. After that, as shown in FIG. 23, insulation layer (80a) and copper foil 4021 are positioned on the first-surface side and insulation layer (90a) and copper foil 4022 are positioned on the second-surface side. Then, thermal pressing is conducted. Accordingly, prepreg (insulation layers (80a, 90a)) is cured and the above members are integrated.

Figure 24:
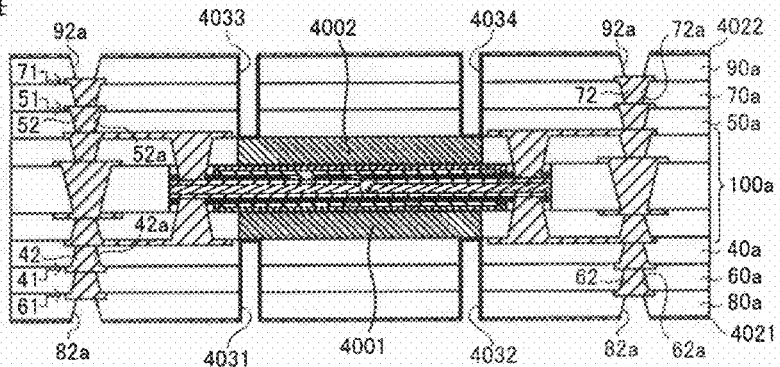
FIG. 24 is a view to illustrate a sixth step subsequent to the step in FIG. 23.

Next, as shown in FIG. 24, holes (82a, 92a) and cut lines (4031-4034) are formed by a laser, for example. Holes (82a) are formed in insulation layer (80a) and holes (92a) are formed in insulation layer (90a). Cut lines 4031 and 4032 are formed through insulation layers (40a, 60a, 80a), and cut lines 4033 and 4034 are formed through insulation layers (50a, 70a, 90a). After that, desmearing and soft etching are conducted if required.

Figure 25:
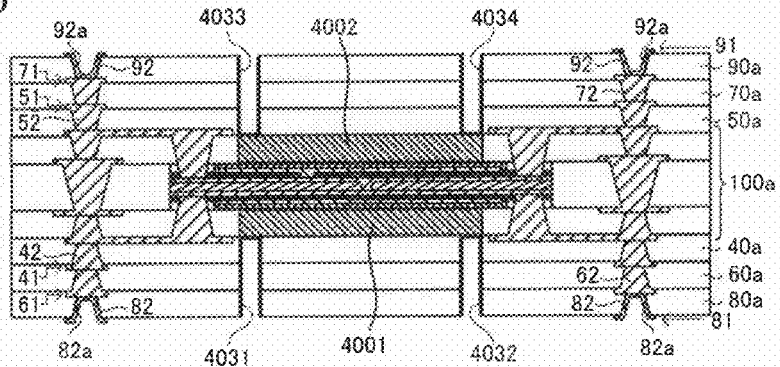
FIG. 25 is a view to illustrate a seventh step subsequent to the step in FIG. 24.

Next, as shown in FIG. 25, plating is formed on the wall surfaces of holes (82a) and plating is formed on the wall surfaces of holes (92a) by copper panel plating (such as either electroless plating or electrolytic plating, or both), for example. Accordingly, conformal conductors (82, 92) are formed. Then, the conductive layers on both surfaces are patterned by a lithographic technique, for example. In doing so, wiring layer 81 is formed on insulation layer (80a) and wiring layer 91 is formed on insulation layer (90a).

Figure 26:
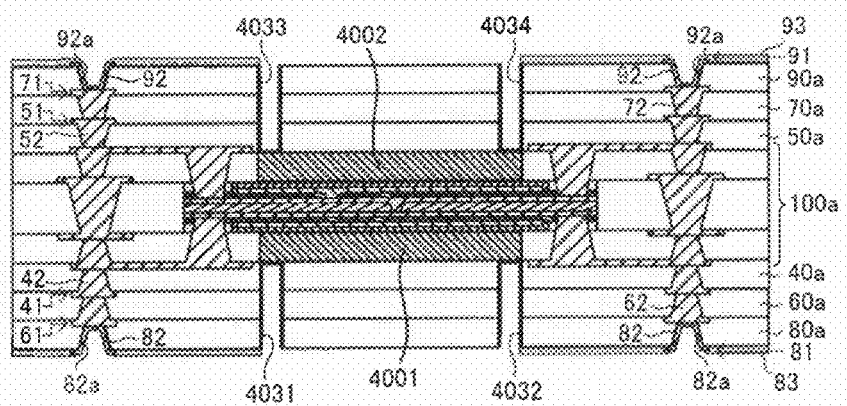
FIG. 26 is a view to illustrate an eighth step subsequent to the step in FIG. 25.

Next, as shown in FIG. 26, solder-resist layers (83, 93) are formed on both surfaces by screen printing or lamination, for example. Then, solder-resist layers (83, 93) are cured by heating, for example. Patterning, drilling and exterior processing are conducted if required.

Next, in step (S14) of FIG. 6, space is formed on both sides (first-surface side and second-surface side) of the central section of flexible wiring board 130. Accordingly, flexible section (R100) (FIG. 1) is formed.

Figure 27:
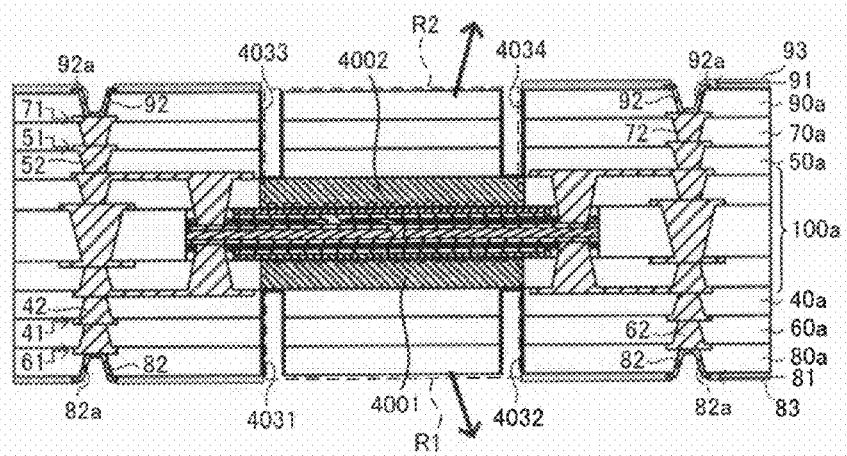
FIG. 27 is a view to illustrate a step for forming a flexible section.

In particular, as shown in FIG. 27, sections corresponding to regions (R1, R2) partitioned by cut lines 4031-4034 are removed by peeling them from both surfaces of flexible wiring board 130. During that time, detaching is easy since strip masks (4001, 4002) are arranged. Accordingly, the central section of flexible wiring board 130 is exposed, and space for allowing flexible wiring board 130 to be curved (bent) is formed on the upper and lower surfaces (directions in which insulation layers are laminated) of flexible wiring board 130. As a result, flex-rigid wiring board 100 (FIG. 1) is completed.

Then, if required, remaining conductors are removed by mask etching, for example. Also, external connection terminals (solder bumps) are formed in opening portions in solder-resist layers (83, 93) by printing solder paste, reflowing and the like. Accordingly, such external connection terminals allow flex-rigid wiring board 100 to be connected with other wiring boards or electronic components to be mounted on flex-rigid wiring board 100. Also, exterior processing, warping correction, conductivity inspection, external inspection, final inspection and the like are conducted according to requirements.

Forming various conductive patterns is not limited to any specific method. For example, conductive patterns may be formed by any one of the following, or any combination of two or more such methods: panel plating method, pattern plating method, full-additive method, semi-additive (SAP) method, subtractive method and tenting method.

The manufacturing method of the present embodiment is suitable for manufacturing above flex-rigid wiring board 100. Using such a manufacturing method, an excellent flex-rigid wiring board 100 is obtained at a lower cost.

So far, a flex-rigid wiring board and its manufacturing method according to an embodiment of the present invention are described. However, the present invention is not limited to the above embodiment.

Figure 28A:
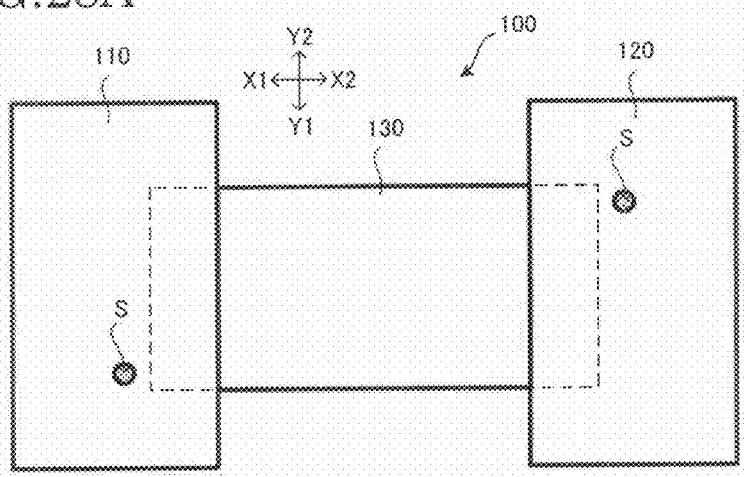
FIG. 28A is a view showing a first alternative example where the positioning of filled stacks is modified.
Figure 28B:
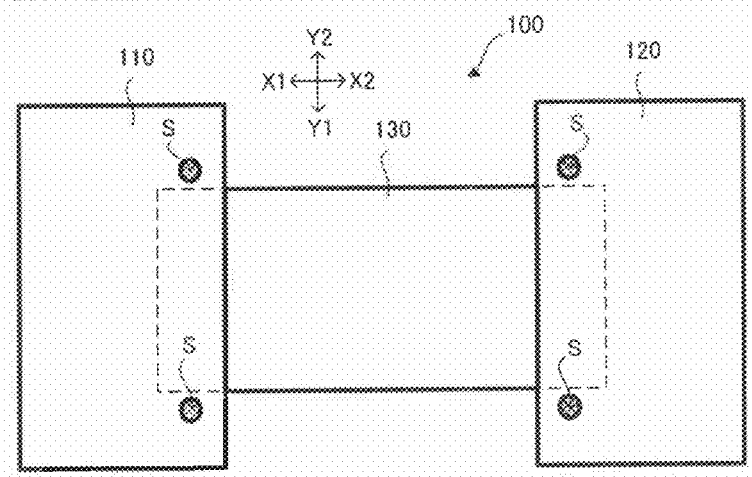
FIG. 28B is a view showing a second alternative example where the positioning of filled stacks is modified.

Positioning filled stacks is not limited specifically. For example, as shown in FIG. 28A, filled stacks "S" may be positioned diagonally by sandwiching flexible wiring board 130. Alternatively, as shown in FIG. 28B, filled stacks "S" may be positioned at the sides (in directions Y) of flexible wiring board 130.

Figure 29A:
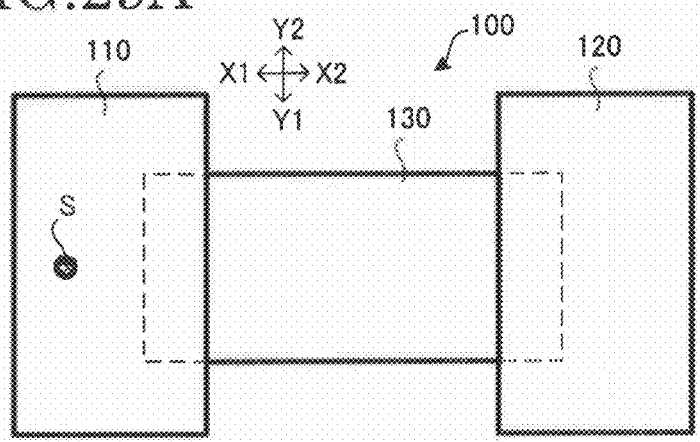
FIG. 29A is a view showing a first alternative example where the number of filled stacks is modified.
Figure 29B:
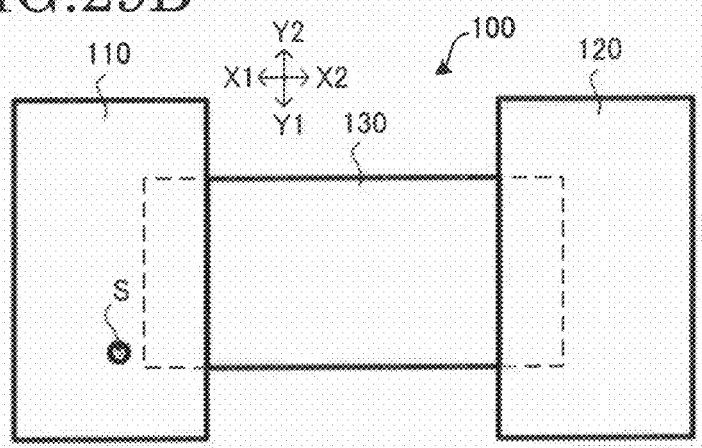
FIG. 29B is a view showing a second alternative example where the number of filled stacks is modified.
Figure 29C:
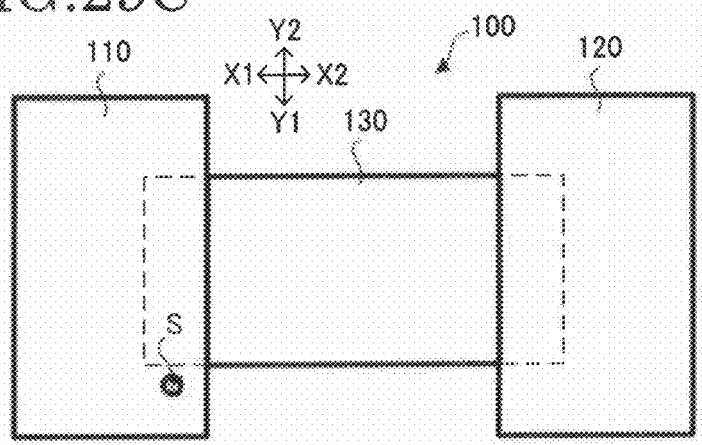
FIG. 29C is a view showing a third alternative example where the number of filled stacks is modified.

The number of filled stacks "S" may be one, as shown in FIGS. 29A-29C), for example. For example, among the multiple filled stacks shown in FIGS. 2A, 2B, 28A and 28B, one remains and the rest may be omitted. FIG. 29A shows an example in which one filled stack "S" in FIG. 2A remains. FIG. 29B shows an example in which one filled stack "S" in FIG. 28A remains. FIG. 29C shows an example in which one filled stack "S" in FIG. 28B remains.

Figure 30A:
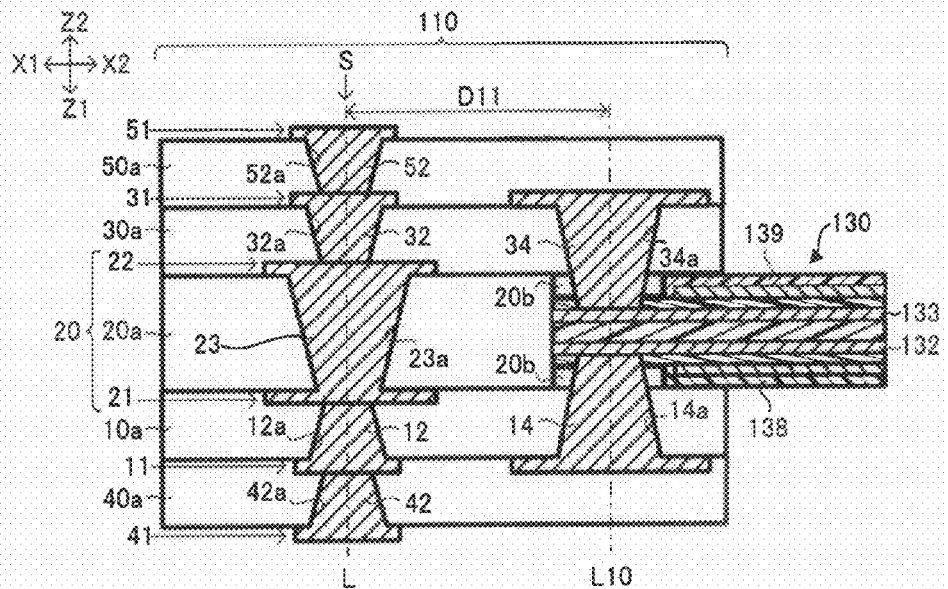
FIG. 30A is a cross-sectional view showing an example where filled conductors for interlayer connections and connection conductors in a flexible wiring board are electrically insulated.

As shown in FIG. 30A, paired filled conductors 14 and 12, and paired filled conductors 34 and 32, may be electrically insulated within each pair. Alternatively, only either pair may be electrically insulated within the pair. Filled stack "S" is positioned along the same axis (axis L), and filled conductors (14, 34) are positioned along the same axis (axis L10). Filled conductor 14 and filled conductor 34 may also be positioned so as to be shifted from axis Z (for example, shifted in directions X or directions Y).

Figure 30B:
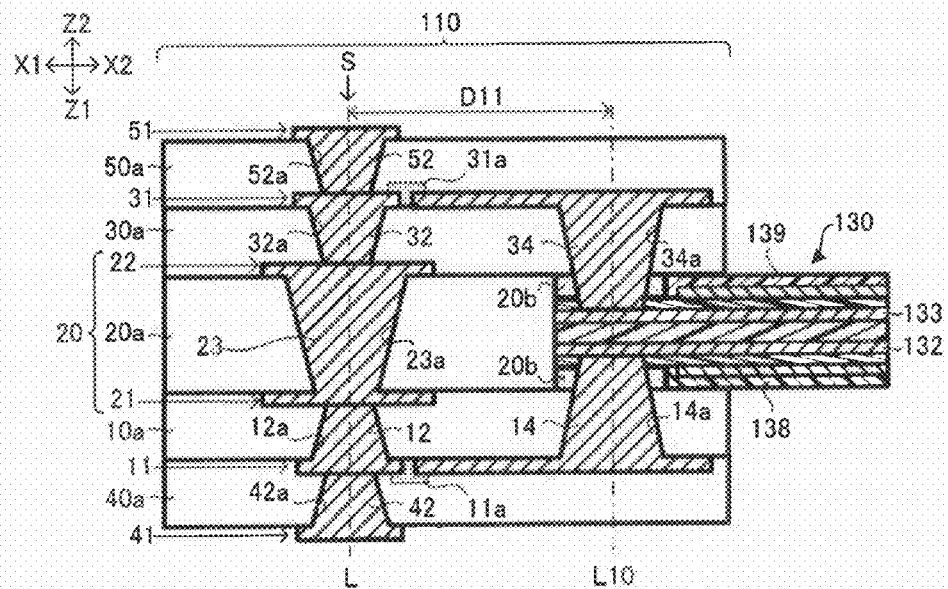
FIG. 30B is a cross-sectional view showing an example where filled conductors for interlayer connections and connection conductors in a flexible wiring board are electrically connected by means of junction conductors.

As shown in FIG. 30B, by placing junction conductors (11a, 31a) between the land of filled conductor 14 and the land of filled conductor 12, and between the land of filled conductor 34 and the land of filled conductor 32, each pair may be electrically connected.

Figure 31:
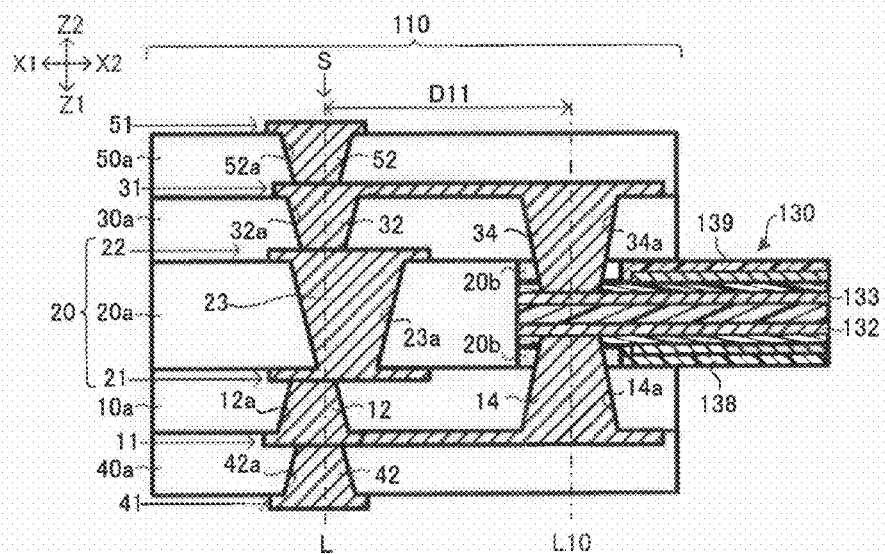
FIG. 31 is a cross-sectional view showing a full-stack structure where filled conductors are not positioned to be concentric circles.

As shown in FIG. 31, even if filled conductors (42, 12, 23, 32, 52 and the like) are not positioned in concentric circles, flex-rigid wiring board 100 may be formed to have a full stack structure.

Figure 32:
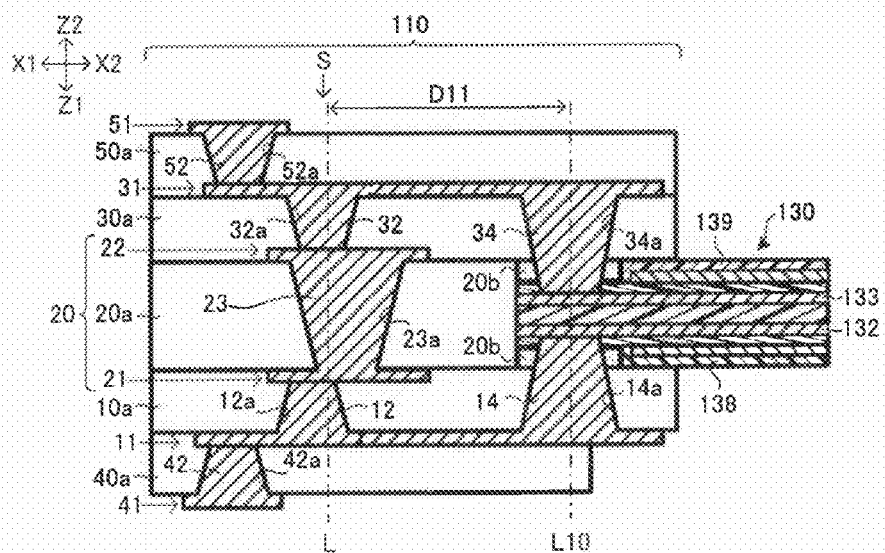
FIG. 32 is a cross-sectional view of a wiring board which does not have a full-stack structure.
Figure 33:
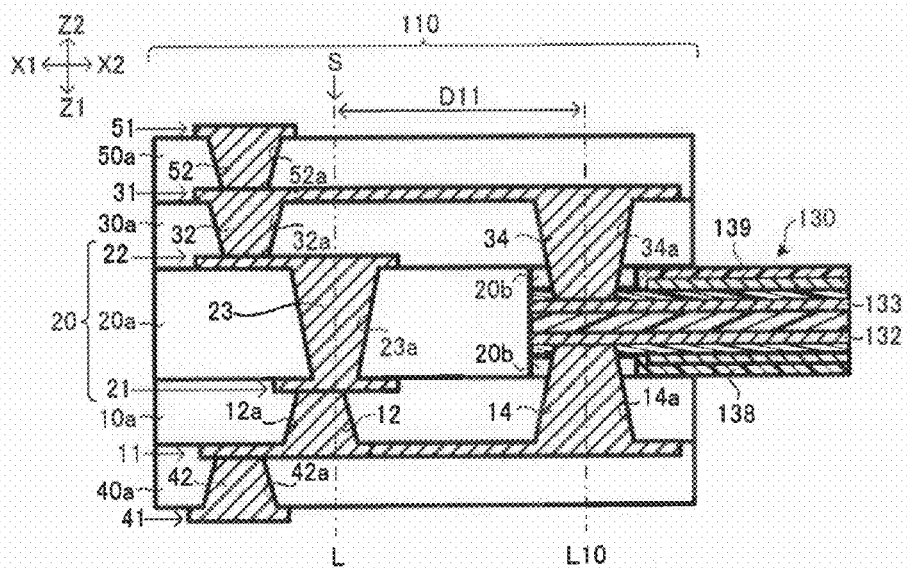
FIG. 33 is a cross-sectional view showing a wiring board where filled conductors in the built-up sections are positioned only on one side of the filled conductor in the core section.

A full stack structure is not always required. For example, as shown in FIG. 32 or 33, if at least filled conductor 23 and filled conductor 12 (or filled conductor 32) are positioned along the same axis, effects such as reduction of wiring lengths or the like are achieved as described previously. However, such effects are greater with a full stack structure.

Figure 34:
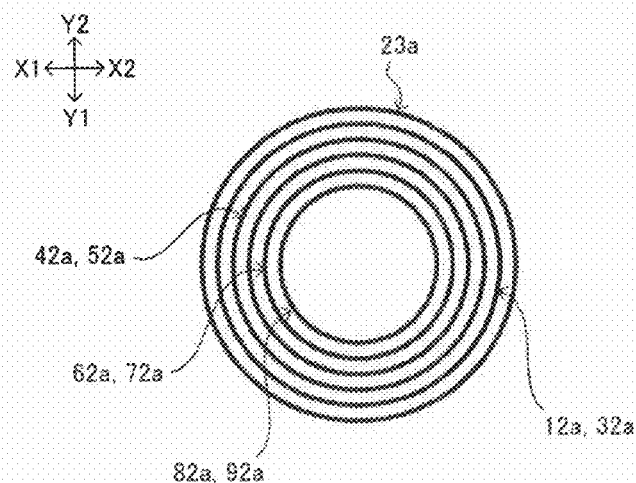
FIG. 34 is a plan view showing another example where sizes in a filled stack are modified.

It is not always required for holes (12a, 32a, 42a, 52a, 62a, 72a, 82a, 92a) to have the same size. As shown in FIG. 34, different sizes may be employed. Alternatively, hole (23a) and holes (12a, 32a, 42a, 52a, 62a, 72a, 82a, 92a) may be formed to have the same size.

Figure 35A:
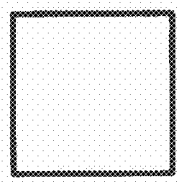

The shape of horizontal cross sections (X-Y plane) of filled conductors, conformal conductors and their lands is not limited to a circle (completely round circle), and any other shape may be employed. The shape of such cross sections may be a square as shown in FIG. 35A, for example, or may be any other regular polygons, such as a regular hexagon and a regular octagon. The shape of angles in such polygons is not limited to any type, and may be a right angle, an acute angle, or an obtuse angle, or may even be roundish, for example. However, to prevent thermal stress from being concentrated, it is preferred that angles be roundish.

Also, the shape of the above horizontal cross sections may be oval, rectangular, triangular or the like. However, such shapes have disadvantages due to their anisotropic characteristics.

The above circles, ovals and regular polygons have advantages since their shapes tend to be similar to the shape of the holes.

Figure 35B:
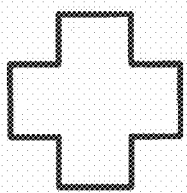
Figure 35C:
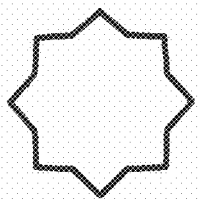

Alternatively, as shown in FIG. 35B or 35C, shapes such as a cross or a regular polygonal star formed by drawing straight lines to radiate out from the center (shapes in which multiple spokes are positioned in a radial pattern) may be effective as the shape of the above horizontal cross sections.

Figure 36:
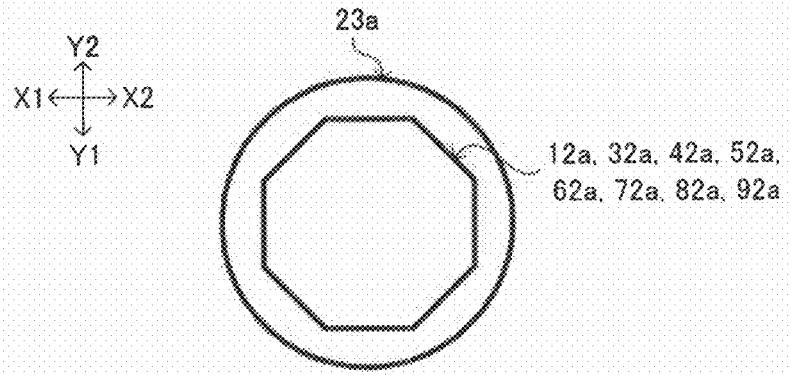
FIG. 36 is a view showing an example in which different shapes are combined for filled conductors and their holes in a filled stack.

The above shapes may be freely combined and employed for the shapes of filled conductors, conformal conductors and their lands. For example, as shown in FIG. 36, different shapes may be combined for filled conductors and their lands.

Figure 37:
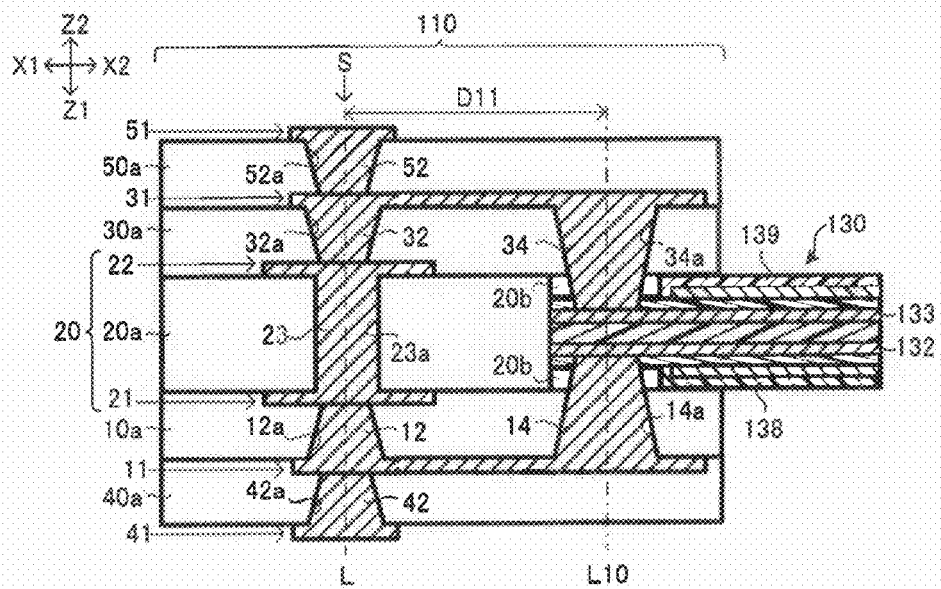
FIG. 37 is a view showing a first alternative example of a vertical cross-sectional shape of a filled conductor in the core section.
Figure 38:
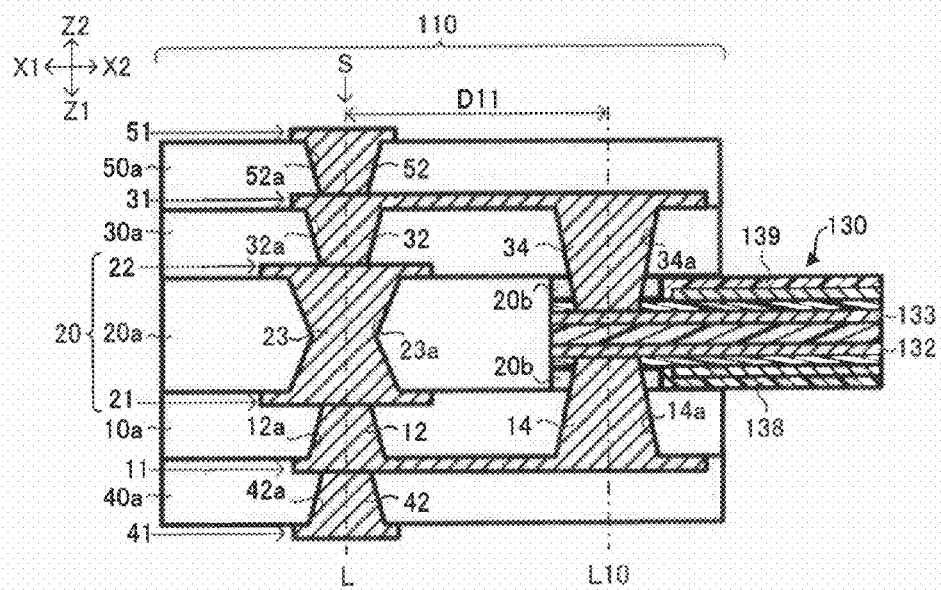
FIG. 38 is a view showing a second alternative example of a vertical cross-sectional shape of a filled conductor in the core section.

The shape of vertical cross sections of filled conductors may be formed freely. For example, as shown in FIG. 37, filled conductor 23 may be formed to be cylindrical. Alternatively, as shown in FIG. 38, filled conductor 23 may be formed like a drum (translator's memo: the drum indicated here is a traditional Japanese small drum, whose cross section is similar to that of an hourglass). If a hole is formed like a drum, since the diameter of the opening portions becomes greater than the diameter of the central portion, it is thought that better performance is expected when the hole is filled by plating. As a result, it is thought that surface flatness features are enhanced.

Figure 39:
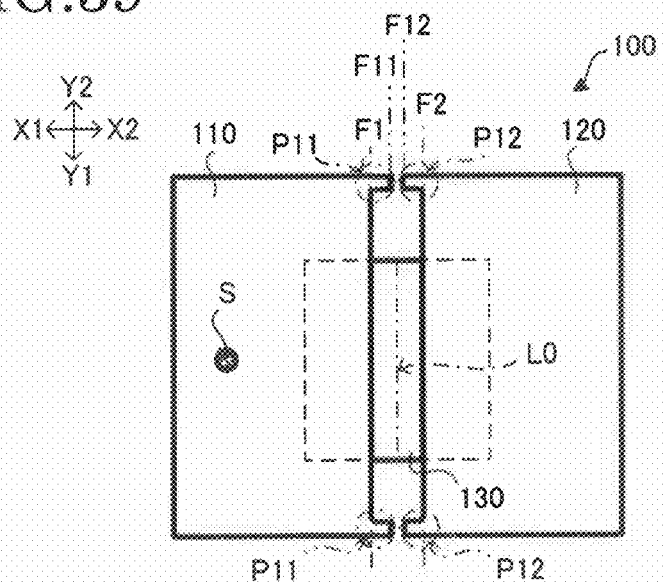
FIG. 39 is a view showing an example in which a rigid section has protruding portions that protrude from the boundary surface with a flexible section.

As shown in FIG. 39, rigid sections (110, 120) may have protruding portions (P11, P12) that protrude from boundary surfaces (F1, F2) (see FIG. 1 as well) positioned between flexible section (R100) and the rigid sections. In an example shown in FIG. 39, rigid section 110 has two protruding portions (P11), and rigid section 120 has two protruding portions (P12). Protruding portions (P11) are positioned on the Y1 side and Y2 side of flexible wiring board 130, and protrude toward the X2 side from boundary surface (F1) between rigid section 110 and flexible section (R100). On the other hand, protruding portions (P12) are positioned on the Y1 side and Y2 side of flexible wiring board 130, and protrude toward the X1 side from boundary surface (F2) between rigid section 120 and flexible section (R100). The planar shape of protruding portions (P11, P12) (the shape on the X-Y plane) is rectangular, for example. It is thought that excessive stress is prevented from occurring in the F-R connection sections by forming such protruding portions (P11, P12). Descriptions of such an effect are provided in the following with reference to FIG. 40.

It is thought that flex-rigid wiring board 100 is folded in two at line (L0) in FIG. 39, for example, and accommodated in casing 5001 of a cell phone or the like. When being folded in two, curved portion (P13) is formed near line (LO) of flexible wiring board 130. In such a case, flex-rigid wiring board 100 may be pressed against casing 5001 due to vibrations or swinging.

Figure 40:
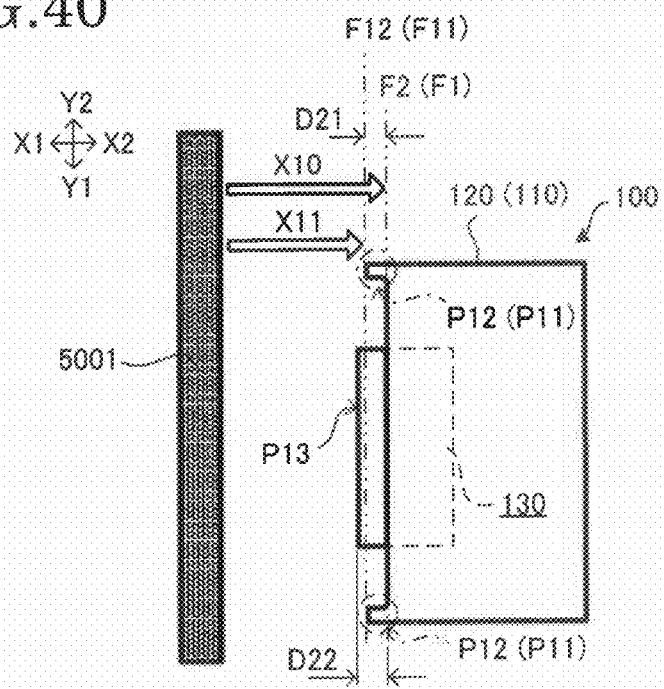
FIG. 40 is a view to illustrate the effects of the protruding portions shown in FIG. 39.

During such time, without protruding portions (P11, P12), casing 5001 may move freely until it touches boundary surface (F1) or (F2) as indicated by arrow (X10) in FIG. 40. In such a situation, if force toward the X2 side is exerted to casing 5001 due to vibrations or the like, it is thought that curved portion (P13) of flexible wiring board 130 is pushed into the X2 side by casing 5001. Moreover, if curved portion (P13) of flexible wiring board 130 is further pushed into near boundary surface (F1) or (F2), great force is generated at the F-R connection sections, and line breakage or the like becomes a concern.

By contrast, with protruding portions (P11, P12), as indicated by arrow (X11) in FIG. 40, the movement of casing 5001 is restricted by top surfaces (F11) of protruding portions (P11) or top surfaces (F12) of protruding portions (P12). Therefore, casing 5001 does not push curved portion (P13) of flexible wiring board 130 any further. Accordingly, stress is seldom generated at the F-R connection sections. As a result, line breakage or the like is suppressed from occurring at the F-R connection sections.

Figure 41:
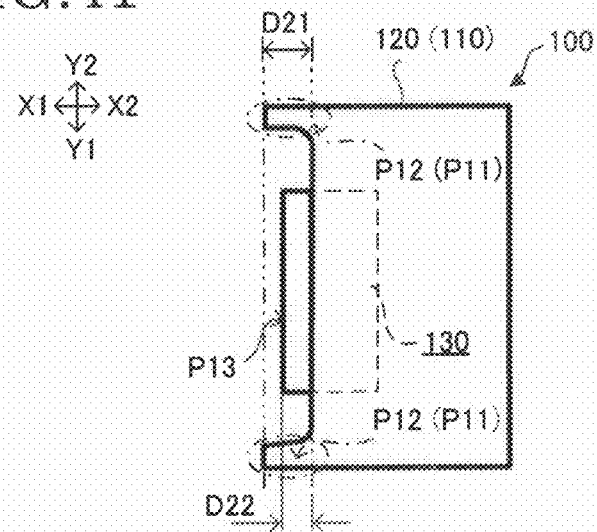
FIG. 41 is a view showing a first alternative example of the form of protruding portions.

The protruding amount (D21) of protruding portions (P11, P12) is approximately 1 mm, for example. The protruding amount (D22) of curved portion (P13) of flexible wiring board 130 is approximately 2-3 mm, for example. Namely, in such an example, (D22) is set greater than (D21) (D21<D22). However, the protruding amounts are not limited to such, and (D22) may be set smaller than (D21) (D22<D21) as shown in FIG. 41, for example. By so setting, it is difficult for casing 5001 to even touch curved portion (P13) of flexible wiring board 130.

Figure 42A:
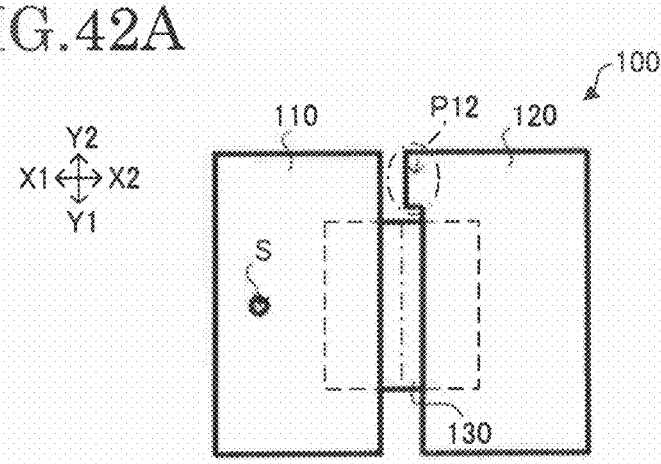
FIG. 42A is a view showing a second alternative example of the form of a protruding portion.
Figure 42B:
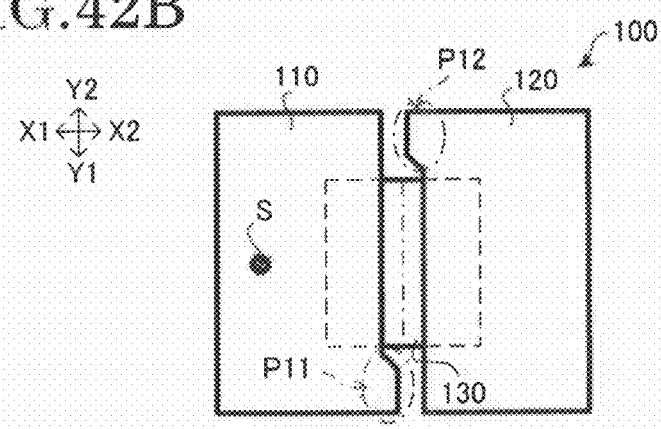
FIG. 42B is a view showing a third alternative example of the form of protruding portions.

The number, shape, positioning and so forth of protruding portions (P11, P12) are not limited specifically. For example, as shown in FIG. 42A, one protruding portion (P12) may be formed only in either rigid section 110 or 120; for example, only in rigid section 120. Alternatively, as shown in FIG. 42B, for example, the planar shape of protruding portions (P11, P12) may be trapezoidal. As in the example shown in FIG. 42B, protruding portion (P11) may be formed on the Y1 side of flexible wiring board 130, and protruding portion (P12) may be formed on the Y2 side of flexible wiring board 130.

Figure 43A:
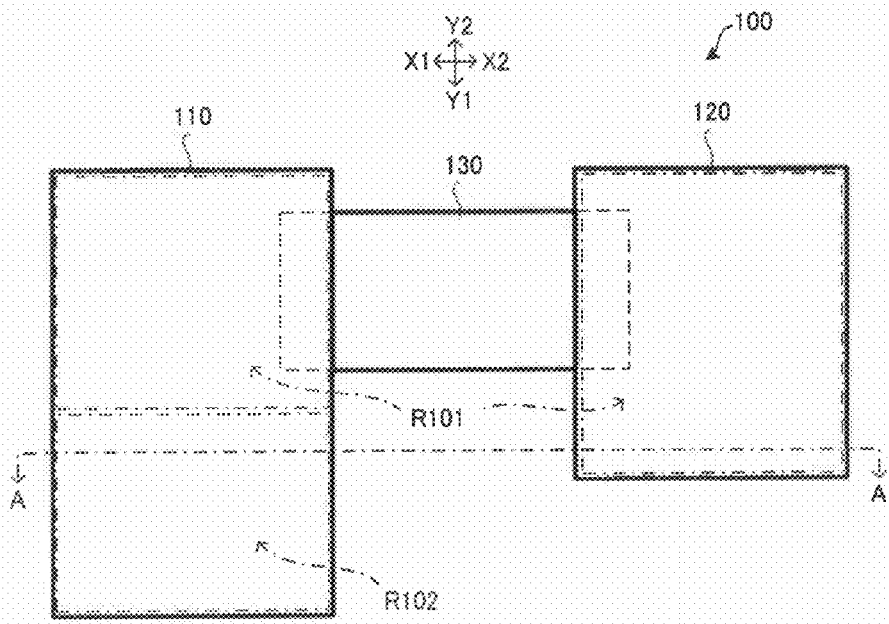
FIG. 43A is a view showing an example where a rigid section has multiple regions with different numbers of layers from each other.
Figure 43B:
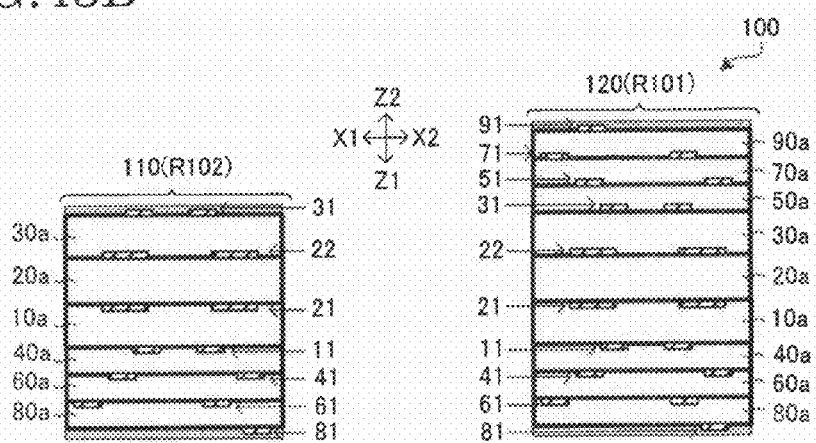
FIG. 43B is a cross-sectional view seen from the A-A line of FIG. 43A.

Rigid section 110 or 120 may contain multiple regions having a different number of layers from each other. For example, as shown in FIG. 43A and FIG. 43B (cross-sectional view seen from the (A-A) line in FIG. 43A), rigid section 110 may have nine-layered region (R101) and six-layered region (R102). Region (R102) having fewer layers than region (R101) may be formed by masking or the like so that more than a predetermined number of layers are not laminated. However, forming methods are not limited to the above, and the number of layers may be adjusted by removing the unnecessary layers after they are laminated.

Figure 44A:
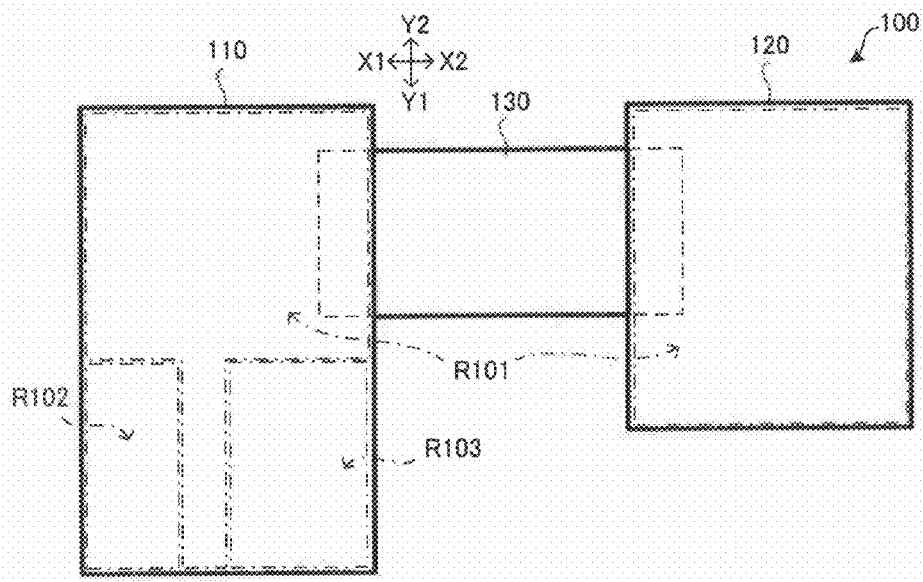
FIG. 44A is a view showing an example where a rigid section has three regions with different numbers of layers from each other.

At least either rigid section 110 or 120 may contain three or more regions having a different number of layers from each other. For example, as shown in FIG. 44A, rigid section 110 may contain three regions (R101-R103) having a different number of layers from each other.

Figure 44B:
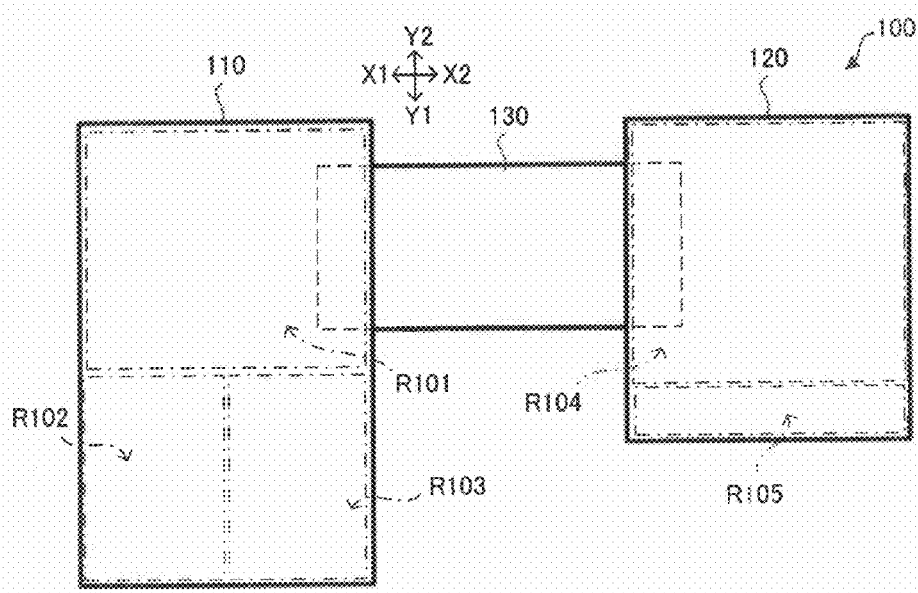
FIG. 44B is a view showing an example where two rigid sections each have multiple regions with different numbers of layers from each other.

Both rigid sections 110 and 120 may contain multiple regions having a different number of layers from each other. For example, as shown in FIG. 44B, rigid section 110 may contain three regions (R101-R103) having a different number of layers from each other, and rigid section 120 may contain two regions (R104, R105) having a different number of layers from each other.

In FIGS. 43A-44B, regions (R101-R105) each have a different number of layers from the other regions. If regions (R101-R105) are listed in order of the region with the most layers to the region with the fewest layers, the order is, for example, region (R101), region (R102), region (R103), region (R104) and region (R105) (region (R101)>region (R102)>region (R103)>region (R104)>region (R105)).

Flex-rigid wiring board 100 may contain electronic components and become an electronic device.

Figure 45:
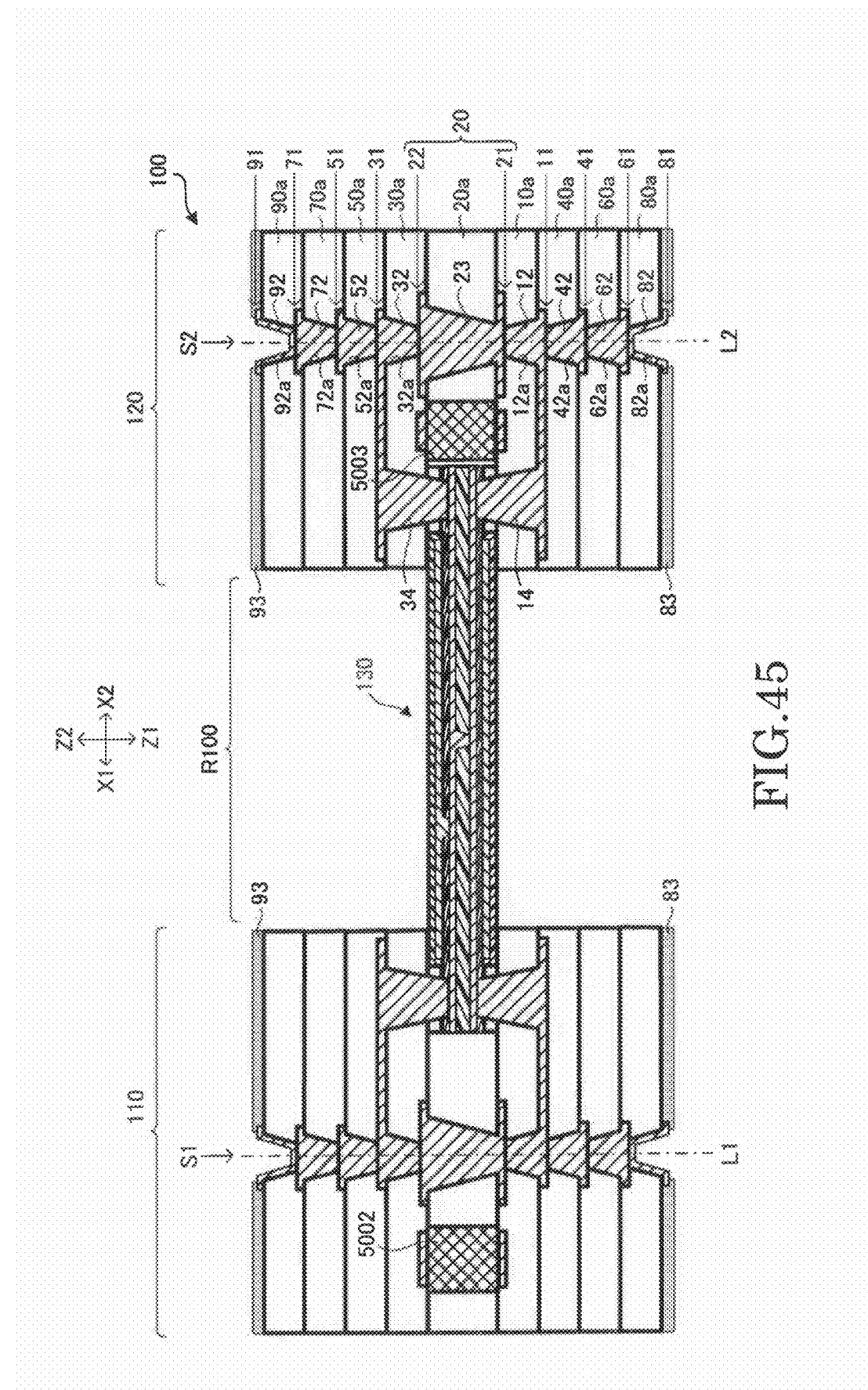
FIG. 45 is a view showing an example of a flex-rigid wiring board with built-in electronic components.

For example, as shown in FIG. 45, electronic component 5002 may be built in rigid section 110 and electronic component 5003 may be built in rigid section 120. In an example shown in FIG. 45, two electronic components (5002, 5003) are built into the board. However, the number of electronic components is not limited specifically. For example, rigid section 110 or 120 may have two or more built-in electronic components. Alternatively, an electronic component may be built into only either rigid section 110 or 120. Using flex-rigid wiring board 100 with built-in electronic components, the electronic device may become highly functional.

Figure 46:
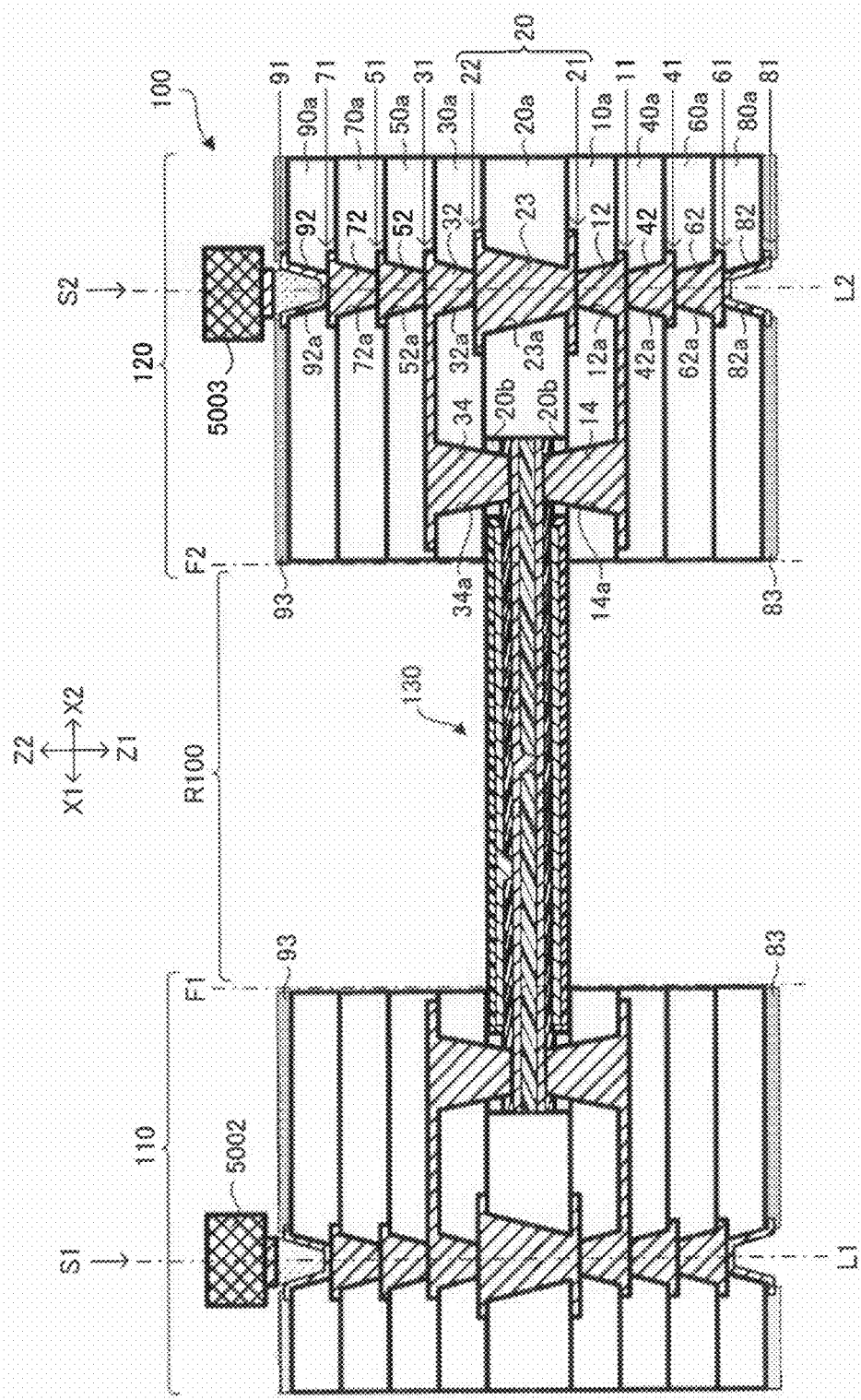
FIG. 46 is a view showing an example of a flex-rigid wiring board with electronic components mounted on a surface.

Alternatively, as shown in FIG. 46, for example, electronic component 5002 may be mounted on a surface of rigid section 110, and electronic component 5003 may be mounted on a surface of rigid section 120. In an example shown in FIG. 46, two electronic components (5002, 5003) are mounted. However, the number of electronic components is not limited specifically. For example, two or more electronic components may be mounted on rigid section 110 or 120. Alternatively, an electronic component may be mounted only on either rigid section 110 or 120.

The number of flexible wiring boards 130 is not limited specifically. For example, to enhance the bendability of flexible section (R100), it is effective if multiple flexible wiring boards are positioned so as to be detached from each other in lamination directions (directions Z) of insulation layers (10a, 20a, 30a), as shown in FIG. 47 or 48.

Figure 47:
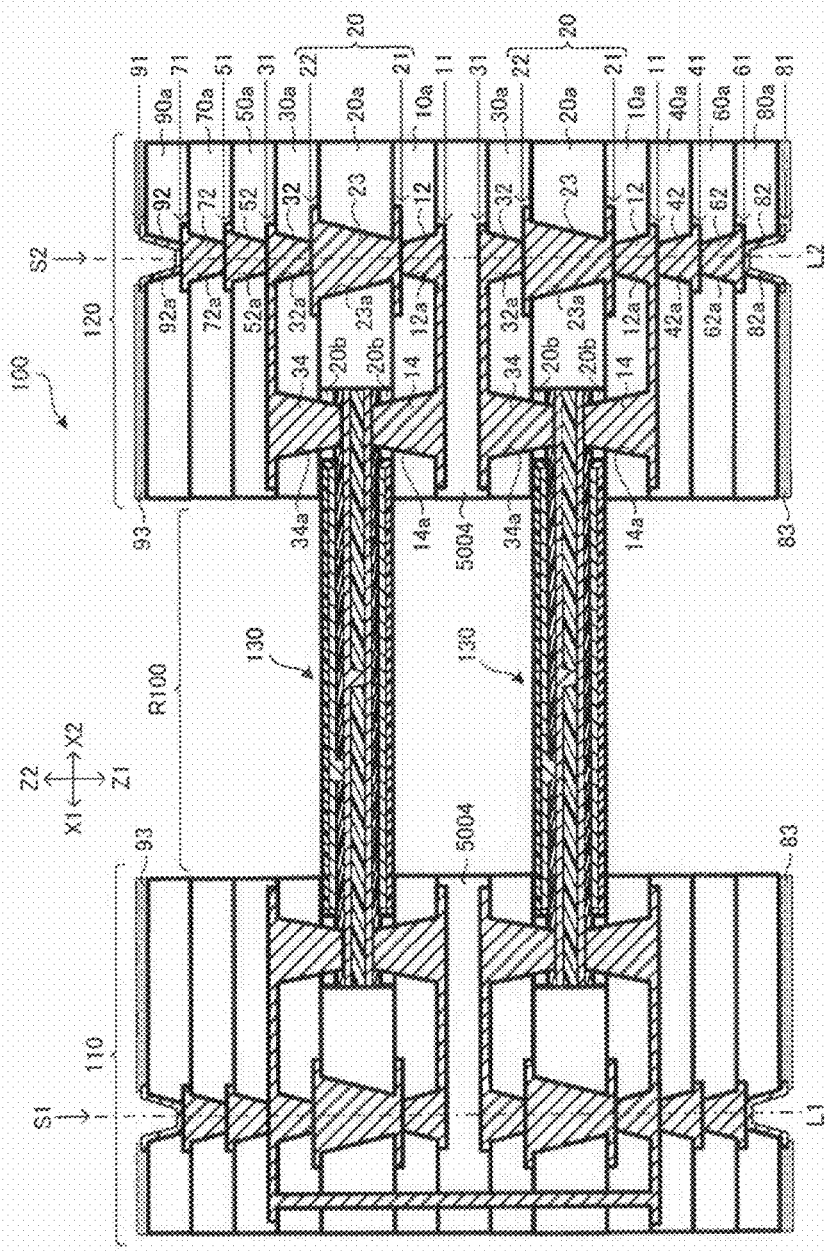
FIG. 47 is a view showing an example of a flex-rigid wiring board having two sets of core sections connected to the flexible wiring board.

In an example shown in FIG. 47, flex-rigid wiring board 100 has two sets of core sections (substrates 20) which are connected to flexible wiring boards 130. The two sets of core sections are connected by means of connection layers 5004. Then, multiple flexible wiring boards 130 are positioned so as to be detached from each other in lamination directions (directions Z). The material for connection layers 5004 is, for example, the same as the above-described interlayer insulation layers (insulation layers (40a) and so forth). Connection layers 5004 are formed by curing prepreg, for example.

Figure 48:
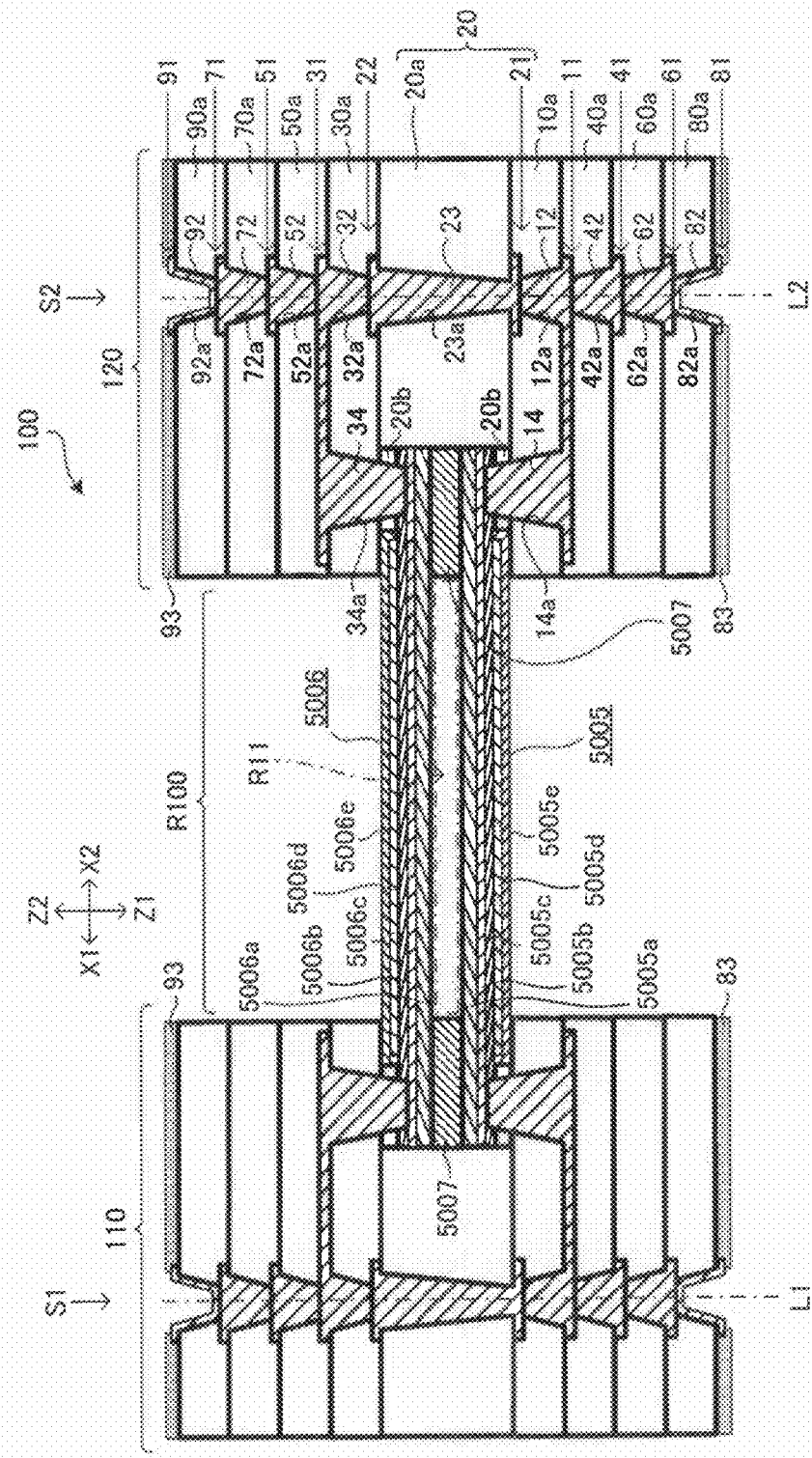
FIG. 48 is a view showing an example of a flex-rigid wiring board having two single-sided flexible wiring boards.

Alternatively, as shown in FIG. 48, for example, flex-rigid wiring board 100 may have two single-sided flexible wiring boards; flexible wiring board 5005 (first flexible wiring board) and flexible wiring board 5006 (second flexible wiring board). Flexible wiring board 5005 has flexible substrate (5005a), wiring layer (5005b), inner coverlay (5005c), shield layer (5005d) and outer coverlay (5005e). Flexible wiring board 5006 has flexible substrate (5006a), wiring layer (5006b), inner coverlay (5006c), shield layer (5006d) and outer coverlay (5006e). The material or the like for each member is the same as for flexible wiring board 130 as shown in FIG. 3, for example.

In an example shown in FIG. 48, flexible wiring board 5005 has wiring layer (5005b) on the first-surface side, and flexible wiring board 5006 has wiring layer (5006b) on the second-surface side. Then, the second-surface side of flexible wiring board 5005 and the first-surface side of flexible wiring board 5006 are physically connected by sandwiching bonding sheet

5007. Space (R11) sealed by bonding sheet 5007 is formed between flexible wiring board 5005 and flexible wiring board 5006. Space (R11) is formed to be a rectangular cuboid, for example. However, the shape, number, positioning and the like of space (R11) are not limited to the above and any other type may be employed (see later-described FIGS. 53A-53C).

A method for manufacturing flex-rigid wiring board 100 shown in FIG. 48 is described in the following. First, two examples are shown in regard to a method for connecting flexible wiring board 5005 and flexible wiring board 5006.

Figure 49A:
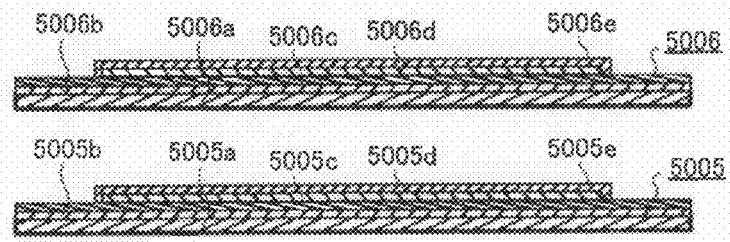
FIG. 49A is a view to illustrate a first step of a first method for connecting two single-sided flexible wiring boards.

In the first example, flexible wiring boards 5005 and 5006 are prepared as shown in FIG. 49A. Such flexible wiring boards 5005 and 5006 may be manufactured by steps that correspond to those shown in FIGS. 10A-10E, for example.

Figure 49B:
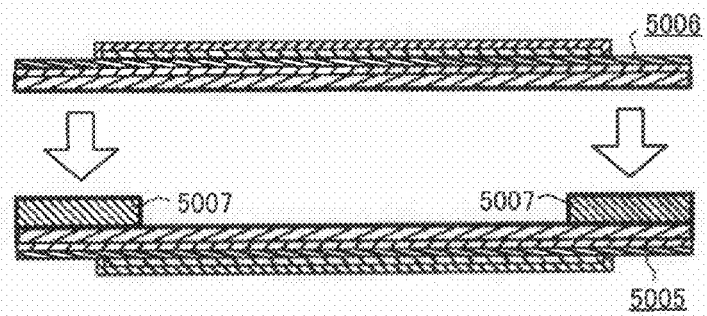
FIG. 49B is a view to illustrate a second step subsequent to the step in FIG. 49A.

Next, as shown in FIG. 49B, flexible wiring board 5005 and flexible wiring board 5006 are connected by means of bonding sheet 5007. In bonding sheet 5007, a hole corresponding to the shape of space (R11) is formed in advance.

Figure 50A:
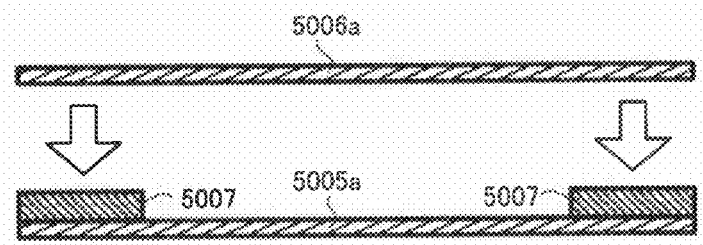
FIG. 50A is a view to illustrate a first step of a second method for connecting two single-sided flexible wiring boards.
Figure 50B:
FIG. 50B is a view to illustrate a second step subsequent to the step in FIG. 50A.

On the other hand, in the second example, as shown in FIG. 50A, flexible substrates (5005*a*, 5006*a*) and bonding sheet 5007 are prepared, and flexible substrate (5005*a*) and flexible substrate (5006*a*) are connected by means of bonding sheet 5007 as shown in FIG. 50B. Then, flexible wiring boards 5005 and 5006 may be manufactured by steps that correspond to those shown in FIGS. 10A-10E, for example.

Figure 51A:
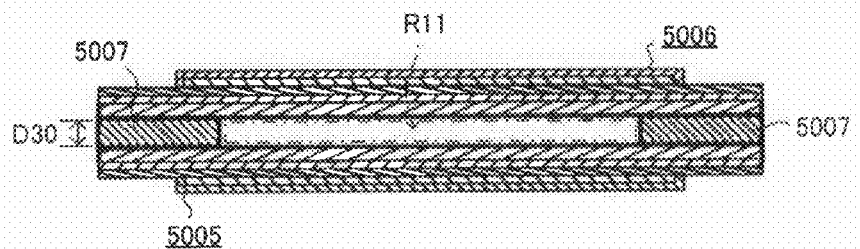
FIG. 51A is a view showing an example of the connected body having two single-sided flexible wiring boards.

A connected body of flexible wiring board 5005 and flexible wiring board 5006 may be manufactured as shown in FIG. 51A by taking either the above first example or the second example. Then, steps that correspond to those shown in FIGS. 11-27, for example, are conducted. In doing so, at both end portions of flexible wiring boards (5005, 5006), filled conductor 14 is connected to wiring layer (5005*b*), and filled conductor 34 is connected to wiring layer (5006*b*). Also, built-up sections, flexible section (R100) or the like are formed. As a result, flex-rigid wiring board 100 is completed as shown in FIG. 48.

It is thought that the bendability of flexible section (R100) is improved by positioning space (R11) between flexible wiring board 5005 and flexible wiring board 5006. Moreover, flexible section (R100) in an example shown in FIG. 48 is structured with two single-sided wiring boards (flexible wiring boards 5005 and 5006). Thus, flexible section (R100) is thinner than an example in which double-sided wiring boards are connected. As a result, it is thought that the bendability of flexible section (R100) is improved.

To improve bendability, height (D30) of space (R11) is preferred to be set at 2 mm or less. Height (D30) of space (R11) corresponds to the thickness of bonding sheet 5007.

Figure 51B:
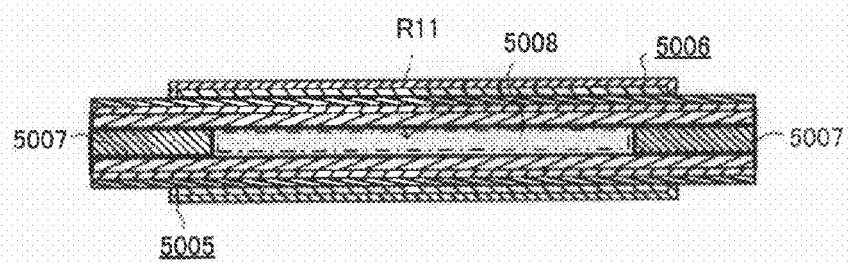
FIG. 51B is a view showing an example where filler is filled in the space arranged between two flexible wiring boards.

Gas such as air may be sealed in space (R11). However, when a heat cycle occurs during the manufacturing steps or the like, there is a concern that quality of flex-rigid wiring board 100 may deteriorate due to the repeated expansion/contraction of the gas in space (R11). Therefore, it is preferred that the gas in space (R11) be eliminated through decompression, for example. Alternatively, as shown in FIG. 51B, by filling filler 5008 (such as gel) in space (R11), the gas in space (R11) may be eliminated.

Figure 52:
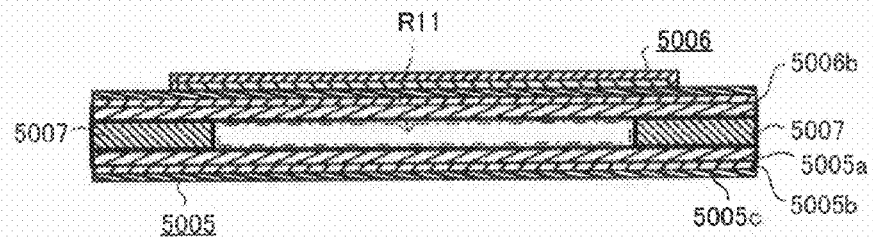
FIG. 52 is a view showing an example in which the conductive pattern on one of the two flexible wiring boards is made to be a full plain conductive pattern.

A conductive pattern of either flexible wiring board 5005 or 5006, for example, wiring layer (5005*b*) of flexible wiring board 5005, may be formed as a full plain conductive pattern (such as a full plain copper pattern) as shown in FIG. 52, and shield layer (5005*d*) and outer coverlay (5005*e*) may be omitted. In doing so, the flexible section becomes even thinner, and it is thought that the bendability of flexible section (R100) is further improved.

When a wiring pattern is formed only on one surface in a method shown in FIGS. (50A, 50B), conductive layers are formed on both surfaces and then the conductive layer on the side of wiring layer (5005*b*) is masked entirely using resist, and the conductive layer on the side of wiring layer (5006*b*) is patterned using a lithographic technique, for example. Accordingly, wiring layer (5006*b*) is formed as a wiring pattern and wiring layer (5005*b*) is formed as a full plain conductive pattern.

Figure 53A:
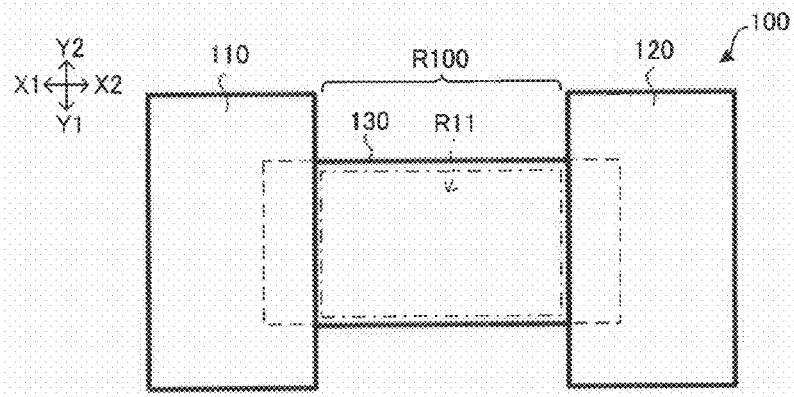
FIG. 53A is a view showing an example where the position of the space arranged between two flexible wiring boards is shown.
Figure 53B:
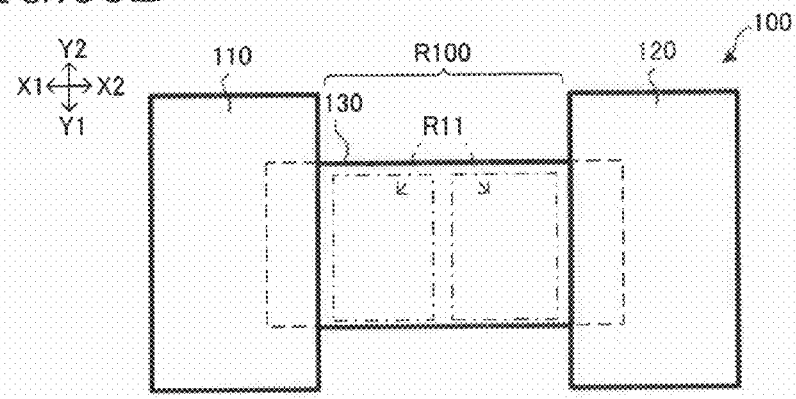
FIG. 53B is a view showing a first alternative example where the number of spaces arranged between two flexible wiring boards is modified.
Figure 53C:
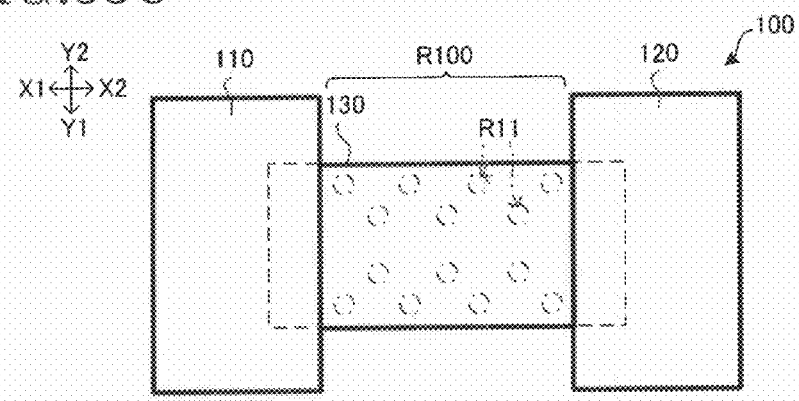
FIG. 53C is a view showing a second alternative example where the number of spaces arranged between two flexible wiring boards is modified.

It is preferred that space (R11) be positioned to extend entirely throughout flexible section (R100) as shown in FIG. 53A, for example. However, space (R11) is not limited to such, and may be positioned by being concentrated in required portions based on stress analysis or the like. The number of spaces (R11) is not limited to one, and multiple spaces may be formed. Namely, as shown in FIG. 53B, for example, two spaces (R11) may be formed, and as shown in FIG. 53C, for example, multiple spaces (R11) may also be formed. The shape of space (R11) is not limited to being a rectangular cuboid, and may be cylindrical as shown in FIG. 53C, for example. Basically, any shape, number, positioning and so forth may be employed for space (R11).

Figure 54:
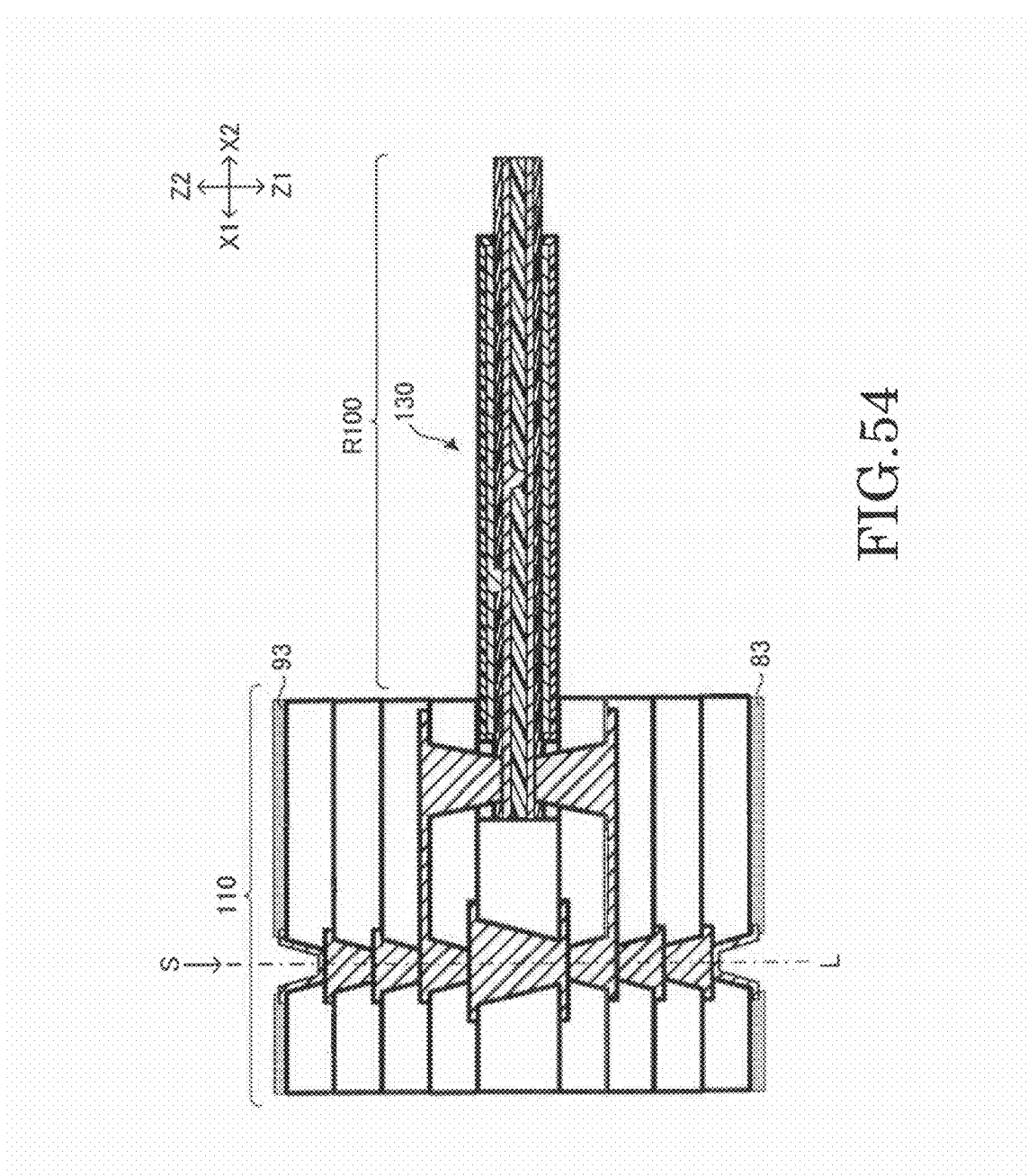
FIG. 54 is a view showing an example of a flying-tail structure.

As shown in FIG. 54, the present invention may be applied to a structure in which only one end of flexible wiring board 130 is connected to rigid section 110 and the other end is not connected to any, a so-called flying-tail structure. In a flying-tail structure, flexible wiring board 130 protrudes like a tail from rigid section 110.

Figure 55:
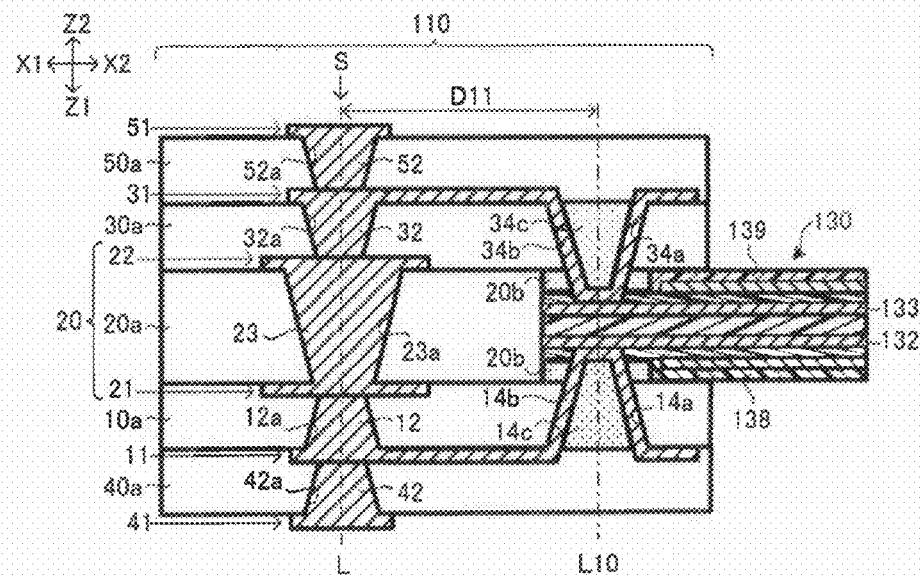
FIG. 55 is a view showing an example where connection conductors connected to conductive patterns of a flexible wiring board are made to be conformal conductors.

As shown in FIG. 55, connection conductors to be connected to conductive patterns (wiring layers 132, 133) in flexible wiring board 130 are not limited to filled conductors (14, 34), and may be conformal conductors (14*b*, 34*b*). In such a case, resin (14*c*) is filled in hole (14*a*) and resin (34*c*) is filled in hole (34*a*), for example.

Figure 56:
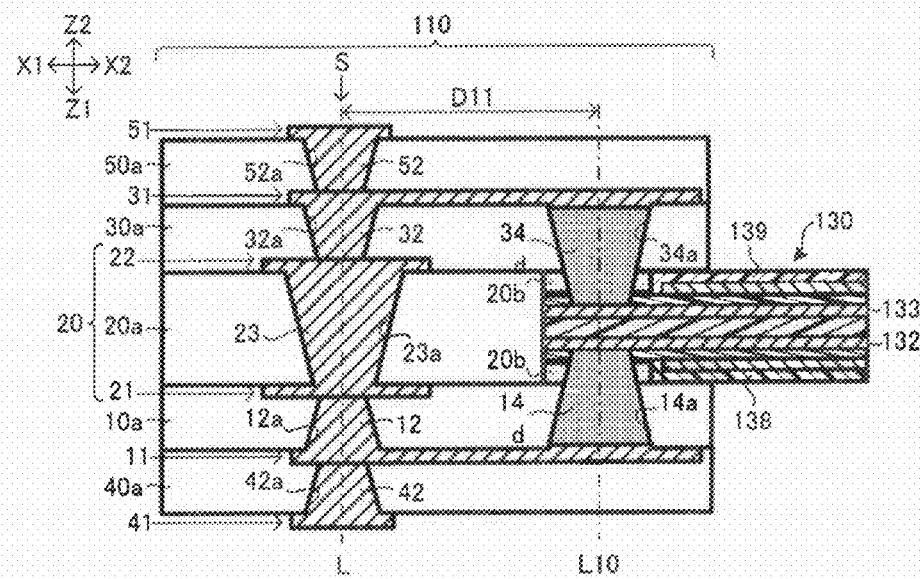
FIG. 56 is a view showing an example where connection conductors connected to conductive patterns in a flexible wiring board are made of conductive paste.

Connection conductors for electrically connecting conductive patterns (wiring layers 132, 133) in flexible wiring board 130 and conductive patterns in rigid section 110 or 120 may be connection conductors (14*d*, 34*d*) made of conductive paste, as shown in FIG. 56. Connection conductors (14*d*, 34*d*) may also be filled conductors or conformal conductors.

Figure 57A:
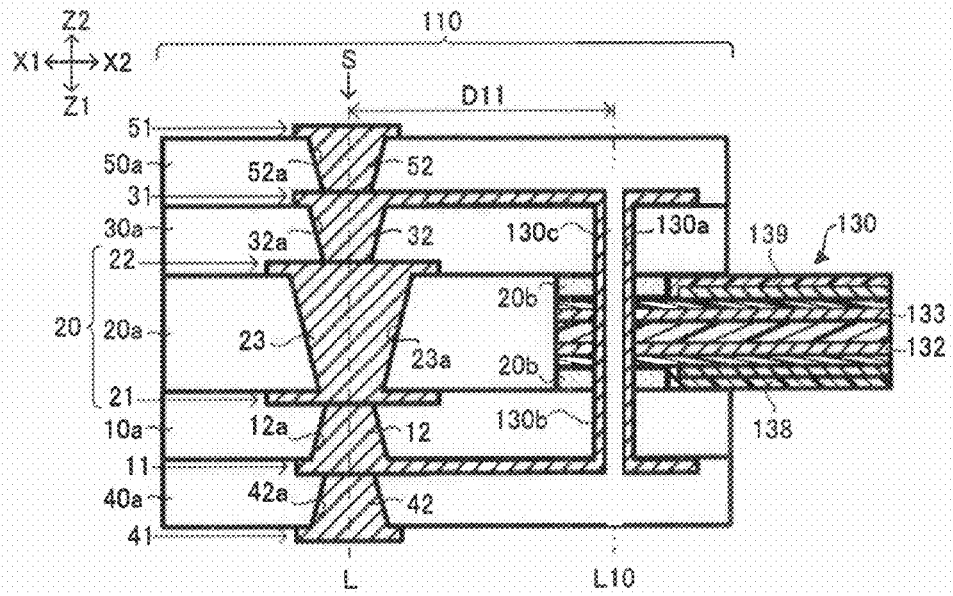
FIG. 57A is a view showing a first example where a connection conductor connected to conductive patterns in a flexible wiring board is the conductor in a through hole.
Figure 57B:
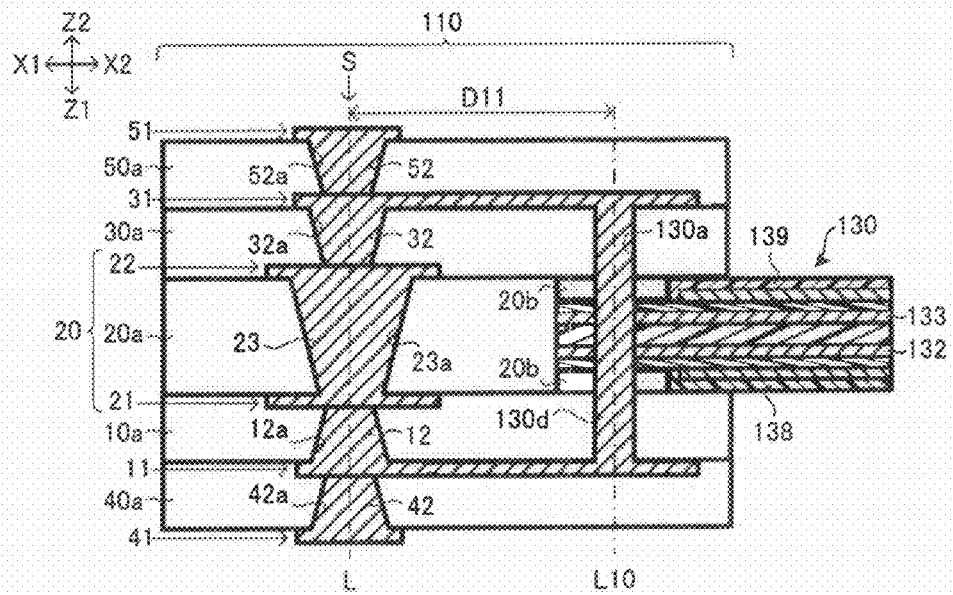
FIG. 57B is a view showing a second example where a connection conductor connected to conductive patterns in a flexible wiring board is the conductor in a through hole.

As shown in FIGS. 57A and 57B, conductive patterns (wiring layers 132, 133) of flexible wiring board 130 and conductive patterns (wiring layers 11, 32) in rigid sections (110, 120) may be electrically connected to each other by conductor (130*b*) or (130*d*) in through hole (130*a*) which penetrates through insulation layer (30*a*), flexible wiring board 130 and insulation layer (10*a*). Conductor (130*b*) shown in FIG. 57A is a conformal conductor. Namely, conductor (130*b*) is formed on the wall surface of through hole (130*a*), and resin (130*c*) is filled inside. On the other hand, conductor (130*d*) shown in FIG. 57B is a filled conductor. Namely, conductor (130*d*) is filled in through hole (130*a*). In those examples, wiring layers (11, 32, 132, 133) are electrically connected by means of conductor (130*b*) or (130*d*). If such a connection method is employed, manufacturing flex-rigid wiring board 100 becomes easier. Through hole (130*a*) may penetrate through rigid section 110 or 120.

Figure 58A:
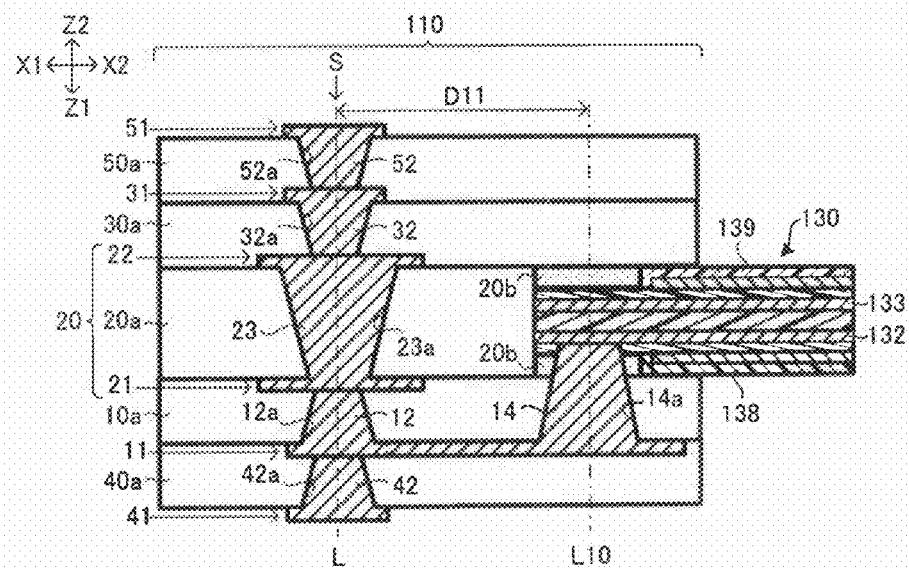
FIG. 58A is a view showing a first example where only either of the wiring layers formed on both surfaces of a flexible wiring board is electrically connected to conductive patterns in a rigid wiring board.
Figure 58B:
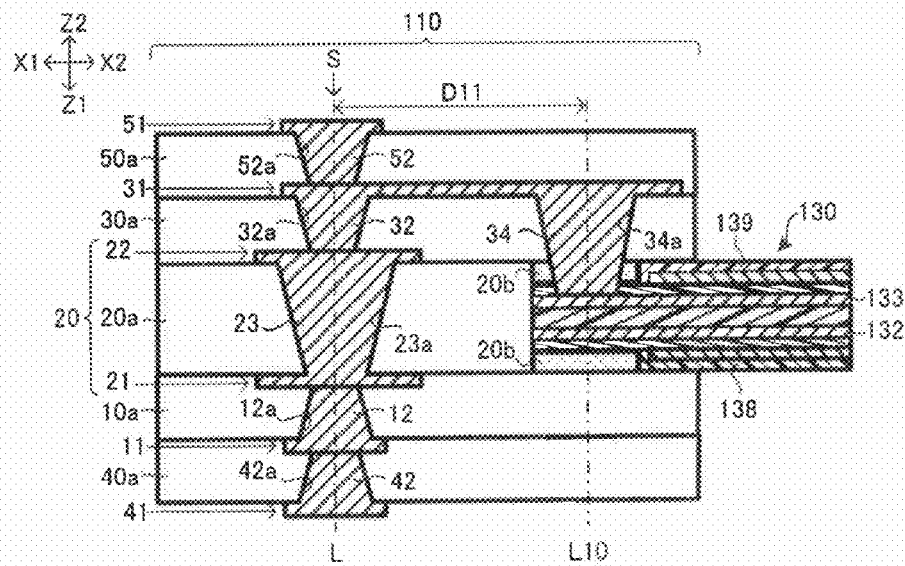
FIG. 58B is a view showing a second example where only either of the wiring layers formed on both surfaces of a flexible wiring board is electrically connected to conductive patterns in a rigid wiring board.

As shown in FIGS. 58A and 58B, only either wiring layer 132 or 133 may be electrically connected to conductive patterns (wiring layers 11, 32) in rigid sections (110, 120). In an example in FIG. 58A, wiring layer 132 and wiring layer 11 are connected by means of filled conductor 14. In an example in FIG. 58B, wiring layer 133 and wiring layer 32 are connected by means of filled conductor 34.

Figure 59:
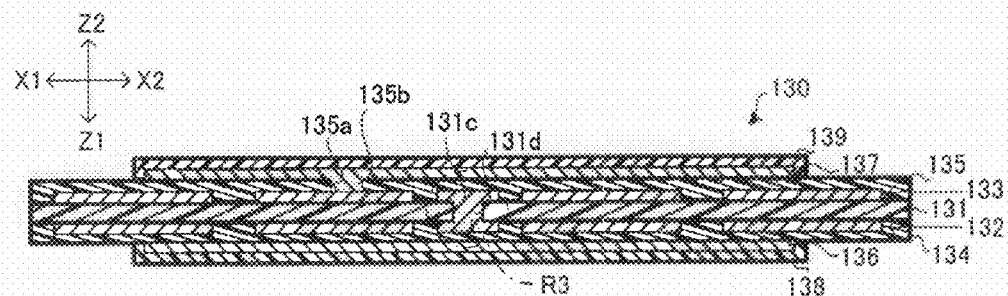
FIG. 59 is a view showing an example of a flexible wiring board where a through hole is formed in a flexible substrate.

As shown in FIG. 59, through hole (131*c*) may be formed in flexible substrate 131. Through hole (131*c*) penetrates through flexible substrate 131. A magnified view of region (R3) in FIG. 59 is shown in FIG. 60A.

Figure 60A:
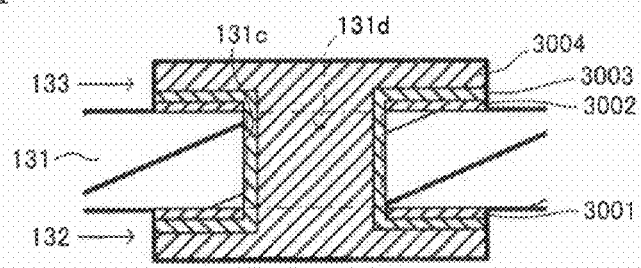
FIG. 60A is a magnified view showing part of the region in FIG. 59.

In an example shown in FIG. 60A, conductor (131d) is filled in through hole (131c). On the first and second surfaces of flexible substrate 131, copper foil 3001 or 3002, electroless plating 3003 and electrolytic plating 3004 are laminated respectively in that order from the lower layer toward the upper layer. Accordingly, wiring layer 132 is formed with copper foil 3001, electroless plating 3003 and electrolytic plating 3004. Also, wiring layer 133 is formed with copper foil 3002, electroless plating 3003 and electrolytic plating 3004, and conductor (131d) is formed with electroless plating 3003 and electrolytic plating 3004. Flexible substrate 131 is made of polyimide, for example. Wiring layers (132, 133), electroless plating 3003 and electrolytic plating 3004 are made of copper, for example.

Wiring layer 132, conductor (131d) in through hole (131c) and wiring layer 133 are formed to be contiguous from the first-surface side of flexible substrate 131 toward the second-surface side. Wiring layer 132 and wiring layer 133 are connected by a junction conductor (131d). Accordingly, a cylinder (conductor 131d) which connects wiring layer 132 and wiring layer 133 is formed in flexible substrate 131. It is thought that wiring layers (132, 133) is secured through the pinning effect of the cylinder and that stability is enhanced in wiring layers (132, 133) formed on the upper and lower surfaces of flexible substrate 131, which has flexibility. In addition, as a result, it is also thought that the positioning stability of the F-R connection sections is improved, leading to enhanced connection reliability.

Figure 60B:
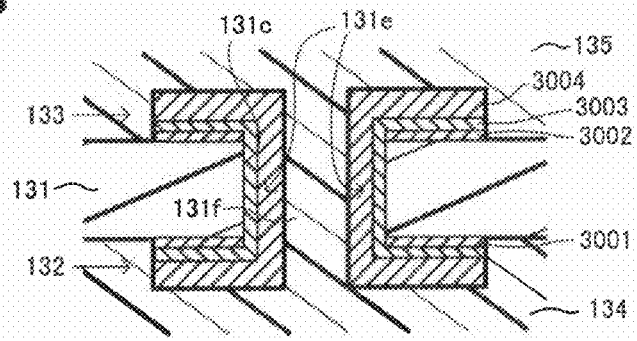
FIG. 60B is a view showing an example where the conductor in a through hole formed in a flexible substrate is a conformal conductor.

As shown in FIG. 60B, conformal conductor (conductor 131e) may be used instead of filled conductor (conductor 131d) to obtain the same structure as above. In an example in FIG. 60B, conductor (131e) is formed on the wall surface of through hole (131c). Conductor (131e) is formed with electroless plating 3003 and electrolytic plating 3004. In such a case, resin (131f), for example, is filled inside conductor (131e). Resin (131f) is filled by the material of inner coverlay 134 or 135 flowing into through hole (131c), for example.

Figure 60C:
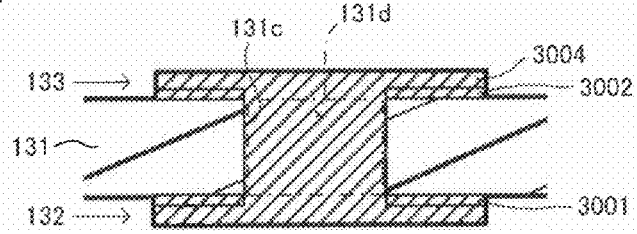
FIG. 60C is a view showing an example where the conductor in a through hole formed in a flexible substrate is made only of electrolytic plating.

If adhesiveness is achieved between electrolytic plating 3004 and flexible substrate 131, electroless plating 3003 may be omitted as shown in FIG. 60C. Alternatively, unless required, copper foils (3001, 3002) may be omitted as well.

Figure 61A:
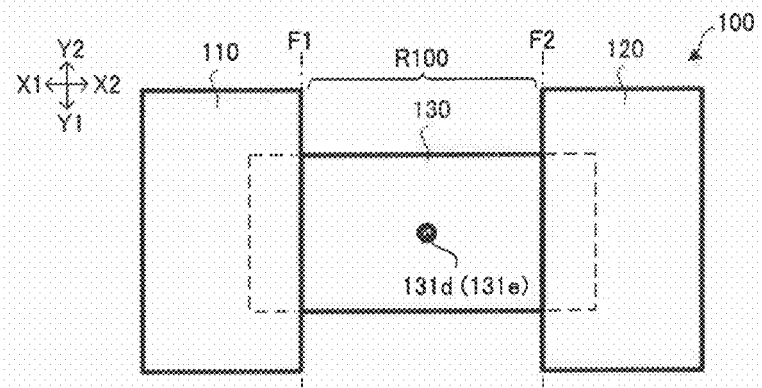
FIG. 61A is a view showing a first example of the position of a through hole formed in a flexible substrate.
Figure 61B:
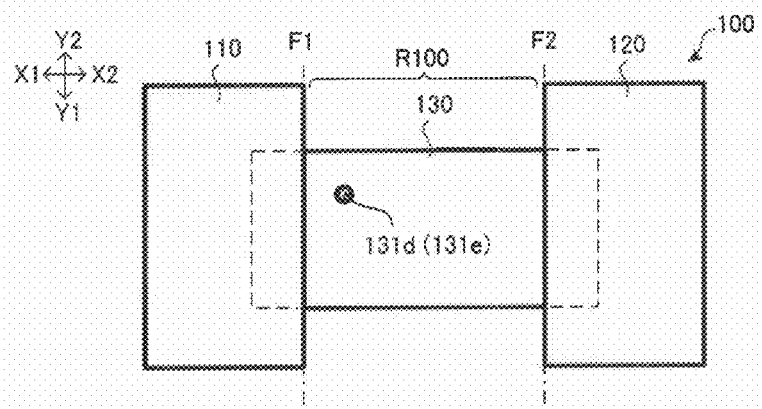
FIG. 61B is a view showing a second example of the position of a through hole formed in a flexible substrate.

As shown in FIG. 61A, for example, it is preferred that conductor (131d) or (131e) be positioned midway between rigid section 110 and rigid section 120. However, as shown in FIG. 61B, it may also be positioned closer to either rigid section 110 or 120. As shown in FIGS. 61A, 61B), it is preferred that conductor (131d) or (131e) be positioned in flexible section (R100). However, conductor (131d) or (131e) is not limited to such positioning, and may be positioned on the side of rigid section 110 at boundary surface (F1) or on the side of rigid section 120 at boundary surface (F2).

Figure 62:
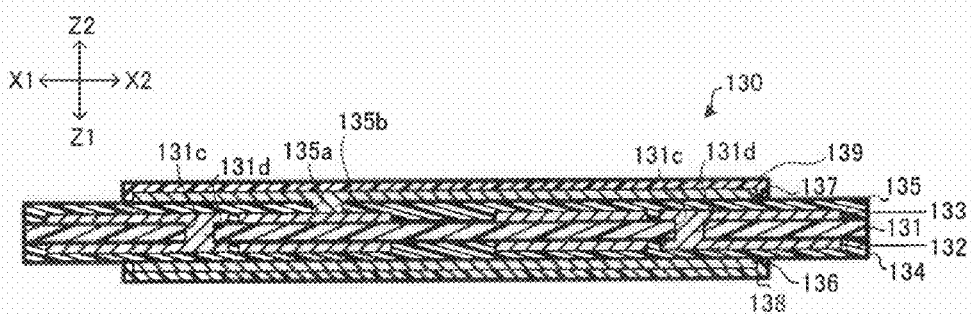
FIG. 62 is a view showing an example where the number of conductors in through holes formed in a flexible substrate is greater than one.

The number of conductors (131d) or (131e) is not limited specifically. For example, as shown in FIG. 62, flexible wiring board 130 may have multiple (such as two) conductors (131d). In the same manner, flexible wiring board 130 may have multiple (such as two) conductors (131e).

In the following, a method is described for manufacturing flexible wiring board 130 as shown in FIGS. 59 and 60A.

Figure 63A:
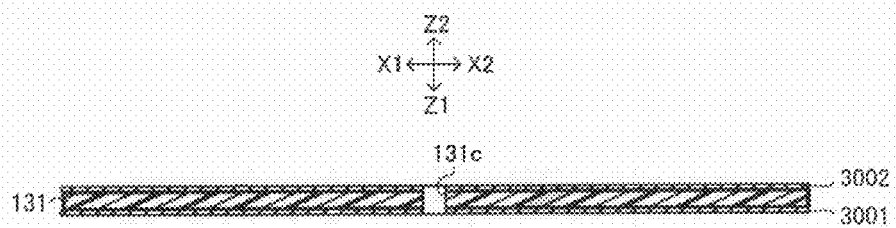
FIG. 63A is a view to illustrate a first step of the method for manufacturing a flexible wiring board shown in FIGS. 59 and 60A.

First, a double-sided copper-clad laminate (starting material) is prepared the same as in the step previously described with reference to FIG. 10A. Then, as shown in FIG. 63A, through hole (131c) is formed in the double-sided copper-clad laminate by a laser, for example.

Figure 63B:
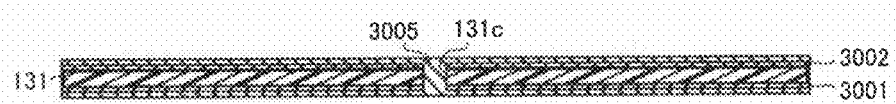
FIG. 63B is a view to illustrate a second step subsequent to the step in FIG. 63A.

Next, as shown in FIG. 63B, plating 3005 is formed by copper panel plating, for example. Specifically, electroless plating and electrolytic plating are performed in that order to form plating 3005 made with electroless plating 3003 and electrolytic plating 3004 (see FIG. 60A). During that time, to enhance the adhesiveness of the plating, surface treatment or the like may be conducted if required.

When flexible wiring board 130 shown in FIG. 60B is manufactured, plating 3005 is formed only on the wall surface of through hole (131c) by performing electroless plating and electrolytic plating. Also, when flexible wiring board 130 shown in FIG. 60C is manufactured, plating 3005 made of electrolytic plating 3004 is formed by performing electrolytic plating.

Figure 63C:
FIG. 63C is a view to illustrate a third step subsequent to the step in FIG. 63B.

Next, as shown in FIG. 63C, conductive layers on both surfaces of flexible substrate 131 are patterned by a lithographic technique, for example. Accordingly, wiring layers (132, 133) are formed.

Then, using the same steps as previously described with reference to FIGS. 10C-10E, for example, inner coverlays (134, 135), shield layers (136, 137) and outer coverlays (138, 139) are formed. Accordingly, flexible wiring board 130 is completed.

Basically, flexible wiring board 130 may be formed freely. For example, as shown in FIGS. 64A-64C, the width of flexible wiring board 130 may be partially enlarged.

Figure 64A:
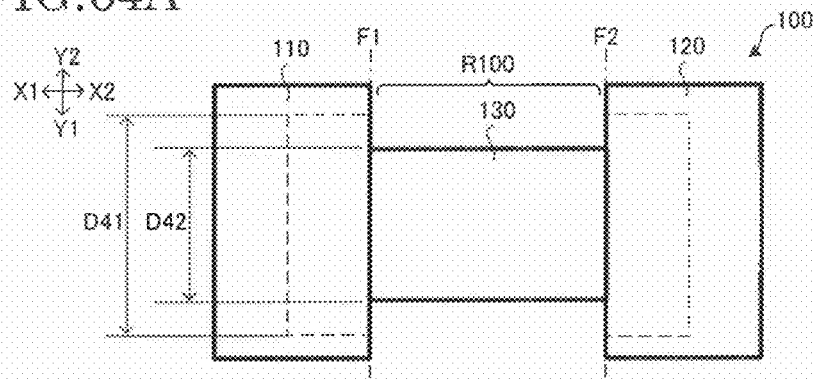
FIG. 64A is a view showing a first example where the width of a flexible wiring board is partially enlarged.

In an example shown in FIG. 64A, when flexible wiring board 130 is divided into two regions at the boundary (boundary surface F1 or F2) between rigid section 110 or 120 and flexible section (R100), width (D41) in the region of rigid section 110 or 120 (the portion where flexible wiring board 130 is inserted into rigid section 110 or 120) is set greater than width (D42) of the region on the side of flexible section (R100) (D41>D42). Accordingly, the connection area increases between flexible wiring board 130 and rigid section 110 or 120. As a result, connection reliability is enhanced at the F-R connection sections. If width (D41) or (D42) is not constant (for example, see FIGS. 64B and 64C), which width is greater may be determined by a comparison of their average values.

Figure 64B:
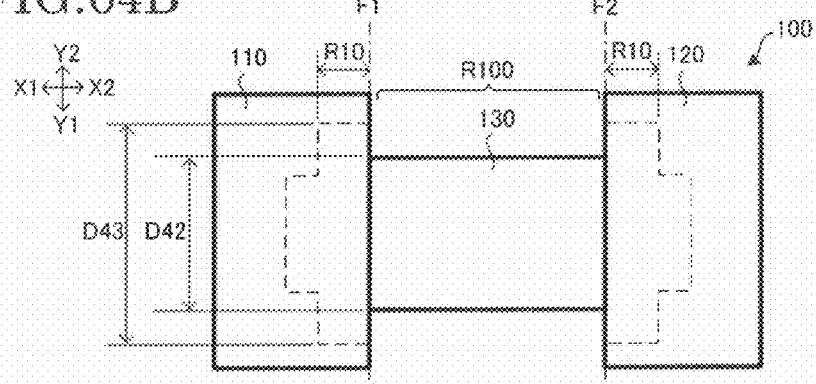
FIG. 64B is a view showing a second example where the width of a flexible wiring board is partially enlarged.

Alternatively, as shown in FIG. 64B, the width of flexible wiring board 130 may be enlarged at region (R10) (see also FIG. 4) where rigid section 110 or 120 and flexible wiring board 130 are laminated and connected. In such an example, width (D43) of region (R10) is set greater than width (D42) of flexible section (R100) (D43>D42). It is thought that such a structure also enhances connection reliability at the F-R connection sections the same as in the example shown in FIG. 64A.

Figure 64C:
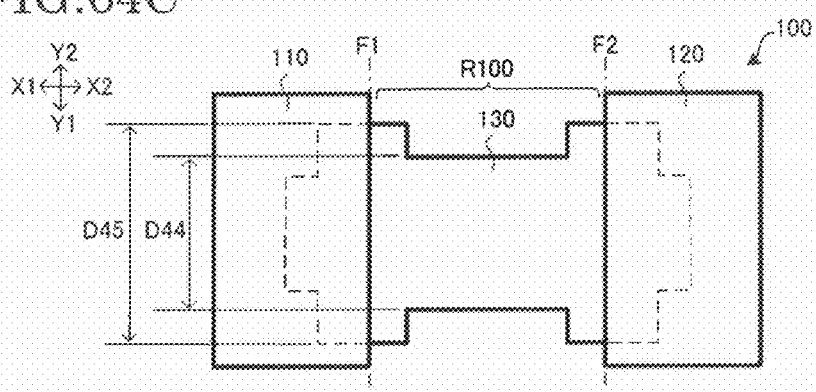
FIG. 64C is a view showing a third example where the width of a flexible wiring board is partially enlarged.

Alternatively, as shown in FIG. 64C, the width of flexible wiring board 130 may also be enlarged around the boundary (boundary surface F1 or F2) between rigid section 110 or 120 and flexible section (R100). In such an example, the width of flexible wiring board 130 is enlarged near the boundary from (D44) to (D45) (D45>D44). It is thought that such a structure also enhances connection reliability at the F-R connection sections the same as in the example shown in FIG. 64A.

Figure 65A:
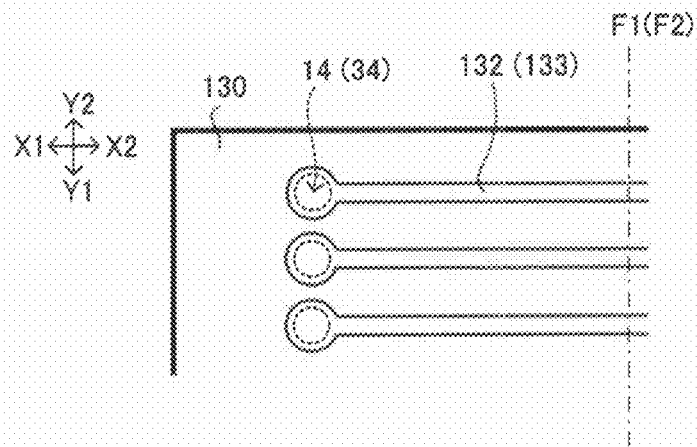
FIG. 65A is a view showing an example where wiring layers at the F-R connection section are formed straight.
Figure 65B:
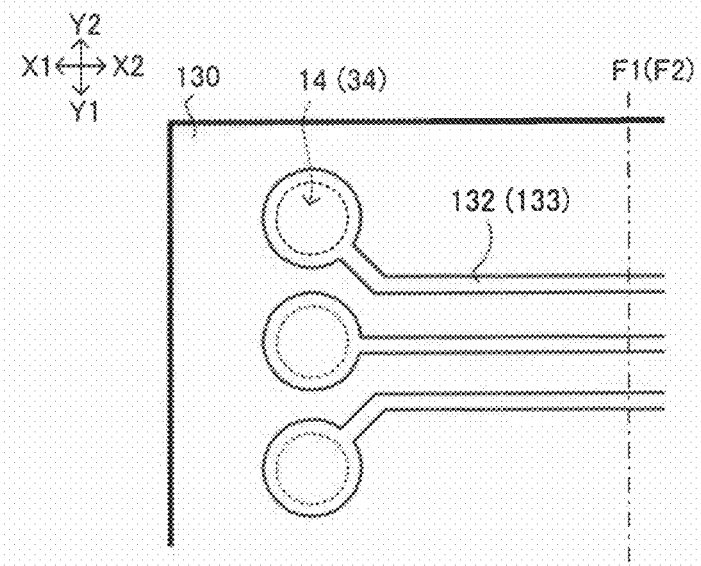
FIG. 65B is a view showing an example where wiring layers are formed to fan out at the F-R connection section.

Basically, conductive patterns (wiring layers 132, 133) of flexible wiring board 130 may be formed freely. Therefore, wiring layers (132, 133) at the F-R connection sections may be formed straight as shown in FIG. 65A. However, to enhance connection reliability at the F-R connection sections, as shown in FIG. 65B, for example, it is preferred that wiring layers (132, 133) be formed to fan out at the F-R connection sections, namely, that terminal pitches be formed to fan out. By setting so, the distance between adjacent wiring lines is secured and interference between wiring lines is suppressed. Accordingly, widths of filled conductors (14, 34) may be enlarged. If widths of filled conductors (14, 34) are enlarged, the connection area between flexible wiring board 130 and rigid section 110 or 120 increases. As a result, connection reliability is enhanced at the F-R connection sections.

Regarding other factors, structures of rigid sections (110, 120), flexible wiring board 130 or the like, as well as type, performance, size, quality, shape, number of layers, positioning and so forth of the elements of such structures, may be modified freely within a scope that does not deviate from the gist of the present invention.

The number of layers in rigid sections (110, 120) and flexible wiring board 130 is not limited specifically. For example, to achieve high functionality, they may be formed to be further multilayered wiring boards. Alternatively, they may be formed as a wiring board with fewer layers (for example, two layers, made of a single-layer core section and a single-layered built-up section). Yet alternatively, the number of layers on each surface (first surface, second surface) of the core section may be different. Alternatively still, layers (wiring layers and insulation layers) may be formed (laminated) on only one surface of the core section.

The material for each wiring layer is not limited to the above, and may be modified according to usage requirements or the like. For example, metal other than copper may be used as the material for wiring layers. Also, the material for each insulation layer is not limited to a specific type. However, as for resins to form insulation layers, thermosetting resins or thermoplastic resins are preferred. As for thermosetting resins, for example, other than epoxy resin, the following may be used: imide resin (polyimide), BT resin, allyl polyphenylene ether resin (A-PPE resin) or aramid resin. Also, as for thermoplastic resins, for example, liquid-crystal polymer (LCP), PEEK resin or PTFE resin (fluoro resin) may be used. Such materials are preferred to be selected according to requirements from the viewpoint of insulation, dielectric properties, tolerance to heat, mechanical features and so forth. In addition, the above resins may contain additives such as a curing agent, a stabilizer, filler or the like. Alternatively, each wiring layer and each insulation layer may be formed with multiple layers having different materials.

The conductor formed inside a hole in a built-up section may be a filled conductor or a conformal conductor. However, to secure the wiring space, a filled conductor is preferred.

The steps in the above embodiment are not limited to the order and contents shown in the flowchart in FIG. 6. The order and contents may be modified freely within a scope that does not deviate from the gist of the present invention. Also, some steps may be omitted according to usage requirements or the like.

The above embodiment, alternative examples and the like may be combined.

A flex-rigid wiring board according to one aspect of the present invention refers to either an upper surface or a lower surface as a first surface and to the other as a second surface. Such a flex-rigid wiring board has the following: a flexible wiring board; a first insulation layer positioned to a side of the flexible wiring board; a second insulation layer laminated on the first-surface side of an end portion in the flexible wiring board and of the first insulation layer; a first conductor formed by filling plating in a first hole which penetrates through the first insulation layer; and a second conductor formed by filling plating in a second hole which penetrates through the second insulation layer. In such a flex-rigid wiring board, the first conductor and the second conductor are positioned along the same axis and are electrically continuous with each other.

A method for manufacturing a flex-rigid wiring board according to another aspect of the present invention includes the following: preparing a flexible wiring board; preparing a first insulation layer having a first conductor formed by filing plating in a through hole; preparing a second insulation layer having a second conductor formed by filling plating in a through hole; preparing a third insulation layer having a third conductor formed by filling plating in a through hole; forming a laminated body by arranging the second insulation layer and the third insulation layer to sandwich an end portion of the flexible wiring board and the first insulation layer so that the first conductor, the second conductor and the third conductor is positioned along the same axis; and setting the first conductor, the second conductor and the third conductor to be electrically continuous with each other by pressing and heating the laminated body.

"Preparing" includes situations in which material and parts are purchased and manufactured accordingly, as well as situations in which finished products are purchased and used accordingly.

In addition, "pressing and heating" may be conducted simultaneously or separately.

Obviously, numerous modifications and variations of the present invention are possible in light of the above teachings. It is therefore to be understood that within the scope of the appended claims, the invention may be practiced otherwise than as specifically described herein.

What is claimed is:

1. A flex-rigid wiring board, comprising:
a flexible wiring board having a conductive pattern;
a first insulation layer positioned adjacent to a side of the flexible wiring board and having a first hole which penetrates through the first insulation layer;
a second insulation layer laminated over the flexible wiring board and the first insulation layer and having a second hole which penetrates through the second insulation layer, the second hole of the second insulation layer being formed along an axis of the first hole of the first insulation layer;
a first conductor structure formed in the first hole of the first insulation layer and comprising a filled conductor formed by filling a plating in the first hole of the first insulation layer;
a second conductor structure formed in the second hole of the second insulation layer and comprising a filled conductor formed by filling a plating in the second hole of the second insulation layer, the second conductor structure being formed along an axis of the first conductor structure and electrically connected to the first conductor structure;
a connection conductor formed through the second insulation layer and directly connected to the conductive pattern on the flexible wiring board; and
a conductive pattern formed on the second insulation layer and connecting the second conductor structure formed in the second insulation layer and the connection conductor directly connected to the conductive pattern on the flexible wiring board.

2. The flex-rigid wiring board according to claim 1, wherein the connection conductor is made of a plating.

3. The flex-rigid wiring board according to claim 1, wherein the connection conductor is made of a conductive paste.

4. The flex-rigid wiring board according to claim 1, further comprising:
a third insulation layer laminated over the flexible wiring board and the first insulation layer on an opposite side of the second insulation layer, the third insulation layer having a third hole which penetrates through the third insulation layer; and a third conductor structure formed in the third hole of the first insulation layer and comprising a filled conductor formed by filling a plating in the third hole of the third insulation layer, wherein the third conductor structure is formed along the axis of the first conductor structure such that the first conductor structure, the second conductor structure and the third conductor structure are positioned along the axis of the first conductor structure and are electrically connected with each other.

5. The flex-rigid wiring board according to claim 1, further comprising an interlayer insulation layer laminated on the second insulation layer and having a fourth conductor structure, wherein the fourth conductor structure is formed along the axis of the first conductor structure and is electrically connected to the first conductor structure and the second conductor structure.

6. The flex-rigid wiring board according to claim 1, further comprising a plurality of interlayer conductor connection structures formed through a plurality of insulation layers, wherein the interlayer conductor connection structures are formed along the axis of the first conductor structure.

7. The flex-rigid wiring board according to claim 1, wherein the second insulation layer and the flexible wiring board have a through hole penetrating through the second insulation layer and the flexible wiring board, the through hole has a conductor formed in the through hole, and the conductive pattern on the second insulation layer and the conductive pattern on the flexible wiring board are connected by the conductor in the through hole.

8. The flex-rigid wiring board according to claim 1, wherein the first insulation layer and the second insulation layer form a rigid section of the flex-rigid wiring board, the flexible wiring board forms a flexible section of the flex-rigid wiring board, and the rigid section of the flex-rigid wiring board has a protruding portion protruding from a boundary surface between the flexible section and the rigid section.

9. The flex-rigid wiring board according to claim 1, further comprising a second flexible wiring board positioned adjacent to the side of the flexible wiring board, wherein the second flexible wiring board is positioned detached from the flexible wiring board in a direction in which the first insulation layer and the second insulation layer are laminated.

10. The flex-rigid wiring board according to claim 9, wherein each of the flexible wiring board and the second flexible wiring board has a conductive pattern, and the conductive pattern of the flexible wiring board and the conductive pattern of the second flexible wiring board are formed such that the conductive pattern of the flexible wiring board and the conductive pattern of the second flexible wiring board are not facing each other.

11. The flex-rigid wiring board according to claim 1, wherein the first insulation layer and the second insulation layer form a plurality of rigid sections in the flex-rigid wiring board, and the rigid sections have a different number of layers from each other.

12. The flex-rigid wiring board according to claim 1, wherein only one end of the flexible wiring board is connected to the first insulation layer and the second insulation layer.

13. The flex-rigid wiring board according to claim 1, wherein the flexible wiring board comprises a flexible substrate, a first conductive pattern formed on one side of the flexible substrate, and a second conductive pattern formed on an opposite side of the flexible substrate, the flexible substrate has a through-hole and a conductor formed in the through-hole, and the first conductive pattern, the conductor in the through-hole and the second conductive pattern are formed contiguous from the one side of the flexible substrate toward the opposite side of the flexible substrate.

14. The flex-rigid wiring board according to claim 1, wherein the first insulation layer and the second insulation layer form a rigid section of the flex-rigid wiring board, the flexible wiring board forms a flexible section of the flex-rigid wiring board, and the flexible wiring board has a width which is enlarged toward a boundary between the rigid section of the flex-rigid wiring board and the flexible section of the flex-rigid wiring board.

15. The flex-rigid wiring board according to claim 1, wherein the first insulation layer and the second insulation layer form a rigid section of the flex-rigid wiring board, the flexible wiring board has a width which is enlarged in a region in which the rigid section of the flex-rigid wiring board and the flexible wiring board are laminated and connected.

16. The flex-rigid wiring board according to claim 1, wherein the first insulation layer and the second insulation layer form a rigid section of the flex-rigid wiring board, the flexible wiring board forms a flexible section of the flex-rigid wiring board, and the rigid section of the flex-rigid wiring board has a width which is set greater than a width of the flexible section of the flex-rigid wiring board.

17. The flex-rigid wiring board according to claim 1, wherein the first insulation layer and the second insulation layer form a rigid section of the flex-rigid wiring board, the flexible wiring board has a conductive pattern formed on the flexible wiring board and fanning out in a connection region of the rigid section of the flex-rigid wiring board and the flexible wiring board.

18. The flex-rigid wiring board according to claim 1, further comprising a built-in electronic component.

19. The flex-rigid wiring board according to claim 1, further comprising an electronic component mounted on a surface of the flex-rigid wiring board.

20. A method for manufacturing a flex-rigid wiring board, comprising:

preparing a flexible wiring board having a conductive pattern;

preparing a first insulation layer having a first hole and a first conductor structure comprising a filled conductor formed by filing a plating in the first hole;

preparing a second insulation layer having a second hole and a second conductor structure comprising a filled conductor formed by filling a plating in the second hole;

preparing a third insulation layer having a third hole and a third conductor structure comprising a filled conductor formed by filling a plating in the third hole;

forming a laminated body comprising the flexible wiring board, the first insulation layer, the second insulation layer and the third insulation such that the flexible wiring board and the first insulation layer are positioned side by side and the second insulation layer and the third insulation layer are sandwiching the first insulation layer and an end portion of the flexible wiring board and that the first conductor structure, the second conductor structure and the third conductor structure are positioned along an axis; and pressing and heating the laminated body such that the first conductor structure, the second conductor structure and the third conductor structure are set to be electrically continuous with each other, wherein the forming of the laminated body comprises forming a conductive pattern on the second insulation layer and forming a connection conductor through the second insulation layer such that the connection conductor is directly connected to the conductive pattern on the flexible wiring board and that the connection conductor connects the conductive pattern on the second insulation layer and the conductive pattern on the flexible wiring board.

21. The method according to claim 20, wherein the conductive pattern on the second insulation layer is connected to the second conductor structure.

\* \* \* \* \*